(12) United States Patent
Hasegawa et al.

(10) Patent No.: US 6,979,500 B2
(45) Date of Patent: Dec. 27, 2005

(54) GMR MAGNETIC SENSING ELEMENT PROVIDED WITH SECOND FREE LAYER EXTENDED TO OUTSIDE OF TRACK WIDTH AND METHOD FOR MANUFACTURING THE SAME

(75) Inventors: Naoya Hasegawa, Niigata-ken (JP); Eiji Umetsu, Niigata-ken (JP)

(73) Assignee: Alps Electric Co., Ltd., Tokyo (JP)

( * ) Notice: Subject to any disclaimer, the term of this patent is extended or adjusted under 35 U.S.C. 154(b) by 4 days.

(21) Appl. No.: 10/603,983

(22) Filed: Jun. 24, 2003

(65) Prior Publication Data
US 2004/0004792 A1  Jan. 8, 2004

(30) Foreign Application Priority Data
Jun. 25, 2002  (JP)  ............................. 2002-184052

(51) Int. Cl.[7] ............................................. G11B 5/127
(52) U.S. Cl. ............................... 428/811.2; 428/811.5; 360/324.12
(58) Field of Search ........................ 428/811.2, 811.5; 360/324.12

(56) References Cited

U.S. PATENT DOCUMENTS

| | | | | |
|---|---|---|---|---|
| 6,462,919 B1 * | 10/2002 | Mack et al. | ............. | 360/327.3 |
| 6,754,056 B2 * | 6/2004 | Ho et al. | ................. | 360/324.2 |
| 6,795,280 B1 * | 9/2004 | Song et al. | ............... | 360/324.2 |
| 2003/0103299 A1 * | 6/2003 | Saito | ...................... | 360/324.12 |
| 2003/0156361 A1 * | 8/2003 | Li et al. | ................. | 360/324.12 |
| 2003/0206384 A1 * | 11/2003 | Hoshiya et al. | ........ | 360/324.12 |

FOREIGN PATENT DOCUMENTS

| | | |
|---|---|---|
| JP | A1 10-124823 | 5/1998 |
| JP | A2 2000-293822 | 10/2000 |

* cited by examiner

*Primary Examiner*—Kevin M. Bernatz
(74) *Attorney, Agent, or Firm*—Brinks Hofer Gilson & Lione

(57) ABSTRACT

A magnetic sensing element is provided, in which magnetization of a free magnetic layer is likely to fluctuate when the track width is further reduced, and thereby, the magnetic field detection sensitivity can be improved. A second free magnetic layer having a dimension W2 in the track-width direction is laminated on a first free magnetic layer having a dimension W1 in the track-width direction while the dimension W2 is larger than the dimension W1. The film thickness ta of the free magnetic layer in the track-width region A is made larger than the film thickness tb of the free magnetic layer in both side regions B and B. Consequently, the magnetic flux density in the track-width region A of the free magnetic layer resulting from the static magnetic fields generated from both the side regions B and B of the free magnetic layer can be reduced, a dead zone which occurs in the track-width region A of the free magnetic layer can be reduced, and therefore, the magnetic field detection sensitivity is improved.

28 Claims, 14 Drawing Sheets

GMR MAGNETIC SENSING ELEMENT PROVIDED WITH SECOND FREE LAYER EXTENDED TO OUTSIDE OF TRACK WIDTH AND METHOD FOR MANUFACTURING THE SAME

BACKGROUND OF THE INVENTION

1. Field of the Invention

The present invention relates to a magnetic sensing element primarily used for a hard disk device, a magnetic sensor and the like and to a method for manufacturing the same. In particular, the present invention relates to a magnetic sensing element having excellent heat resistance and electrostatic-discharge-damage resistance and to a method for manufacturing the same.

2. Description of the Related Art

FIG. 15 is a partial sectional view of the structure of a conventional magnetic sensing element, viewed from the side of a surface facing a recording medium.

A multilayer film 5 composed of a first antiferromagnetic layer 1, a pinned magnetic layer 2, a non-magnetic material layer 3 and a free magnetic layer 4 is provided on a substrate, not shown in the drawing. A pair of ferromagnetic layers 6 and 6 and a pair of second antiferromagnetic layers 7 and 7, each having a spacing in the track-width direction, are laminated on the free magnetic layer 4. Electrodes 8 and 8 are provided on the second antiferromagnetic layers 7 and 7.

The magnetization of the pinned magnetic layer 2 is pinned in the Y direction shown in the drawing by an exchange coupling magnetic field generated between the first antiferromagnetic layer 1 and the pinned magnetic layer 2. On the other hand, the magnetization of the free magnetic layer 4 is aligned in the X direction shown in the drawing by exchange coupling magnetic fields generated between the second antiferromagnetic layers 7 and 7 and the ferromagnetic layers 6 and 6.

A system in which magnetization control of the free magnetic layer 4 is performed by the exchange coupling magnetic fields between the second antiferromagnetic layers 7 and 7 and the ferromagnetic layer 6 and 6, as shown in FIG. 15, is referred to as an exchange bias system.

The track-width dimension Tw of the magnetic sensing element shown in FIG. 15 is regulated by the spacing in the track-width direction (the X direction shown in the drawing) between the second antiferromagnetic layers 7 and 7.

The magnetization of both side regions C and C of the free magnetic layer 4 overlapping the second antiferromagnetic layers 7 and 7 is strongly pinned in the track-width direction (the X direction shown in the drawing) in order that the magnetization direction does not fluctuate even when an external magnetic field is applied. On the other hand, the magnetization of the central portion (sensitive region) D of the free magnetic layer, sandwiched between the second antiferromagnetic layers 7 and 7, is aligned in the track-width direction, following the magnetization of both the side regions C and C. However, adjustment is performed in order that the magnetization direction fluctuates when an external magnetic field is applied.

The magnetic sensing element of the exchange bias system can properly perform magnetization control of the free magnetic layer 4 even when the dimension of the track-width dimension Tw is reduced, and therefore, the magnetic sensing element is believed to become the mainstream of magnetic sensing element matching a future increase in packing density.

However, the magnetic sensing element shown in FIG. 15 has the following problems.

The ferromagnetic layers 6 and 6 are laminated on both the side regions C and C of the free magnetic layer 4 of the magnetic sensing element shown in FIG. 15. In both the side regions C and C, the total film thickness Tt of the free magnetic layer 4 and the ferromagnetic layers 6 and 6 is larger than the film thickness Tf of the central portion D simply composed of the free magnetic layer 4.

Consequently, static magnetic fields E generated from the ferromagnetic layers 6 and 6 and static magnetic fields generated from both the side regions C and C of the free magnetic layer 4 enter into the central portion D, and the magnetization of the central portion D, in particular the magnetization of regions adjacent to both the side regions C and C is pinned.

As a result, a dead zone in which magnetization is unlikely to fluctuate with respect to an external magnetic field is generated in the central portion D, and in addition, the ratio of this dead zone to the track-width dimension is increased with such a reduction in track that the track-width region of the free magnetic layer is reduced to 0.18 μm or less. Consequently, the playback sensitivity is lowered.

Regarding a magnetic sensing element shown in FIG. 16, in which second antiferromagnetic layers 7 and 7 are directly laminated on both side regions C and C of a free magnetic layer 4, a phenomenon, in which static magnetic fields generated from both the side regions C and C of the free magnetic layer 4 enter into the central portion D, and the magnetization of the central portion D is pinned, occurs as well. Therefore, a problem occurs in that a dead zone is generated in the central portion D.

In FIG. 8 of Japanese Unexamined Patent Application Publication No. 10-124823, a magnetoresistance effect element (magnetic sensing element) is described, in which the film thicknesses of outer portions of both end portions (both side regions) of a magnetized free layer (free magnetic layer) are made smaller than the film thickness of a magnetic field detecting portion (central portion). This structure is believed to be able to reduce static magnetic fields which are generated from the outer portions of both the end portions of the magnetized free layer and which enter into the magnetic field detecting portion.

In the magnetic sensing element described in FIG. 8 of Japanese Unexamined Patent Application Publication No. 10-124823, the outer portions of both the end portions of the magnetized free layer are cut by etching so as to become thin, and films made of, e.g. an antiferromagnetic material, for applying bias magnetic fields are laminated thereon, as is clear from the description in the paragraph (0067) in the specification.

However, even when the film made of an antiferromagnetic material is laminated on an etched surface of the magnetized free layer made of an antiferromagnetic material, sufficient exchange coupling magnetic field cannot be generated. That is, regarding the magnetoresistance effect element described in FIG. 8 of Japanese Unexamined Patent Application Publication No. 10-124823, a problem of side leading becomes significant, in which the outer portions of both the end portions other than the magnetic field detecting portion also detect the magnetic field.

SUMMARY OF THE INVENTION

The present invention is to overcome the above-mentioned conventional problems. Accordingly, it is an object of the present invention to provide a magnetic sensing element of an exchange bias system and a method for manufacturing the same, wherein a dead zone generated in the central portion of a free magnetic layer can be reduced, and in addition, an increase in side leading can be suppressed.

The magnetic sensing element of the present invention is provided with a multilayer film including a first antiferromagnetic layer, a pinned magnetic layer, a non-magnetic material layer and a free magnetic layer in that order from the bottom, wherein the above-mentioned free magnetic layer includes a first free magnetic layer having a predetermined dimension in the track-width direction and a second free magnetic layer which is provided on the above-mentioned first free magnetic layer and which has a dimension in the track-width direction larger than that of the above-mentioned first free magnetic layer, a second antiferromagnetic layer for aligning the magnetization direction of the above-mentioned free magnetic layer in one direction is provided as a layer above the above-mentioned second free magnetic layer, and a pair of electrode layers are provided on both side portions of the multilayer film.

Here, a dimension in the track-width direction refers to a smaller dimension of a dimension in the track-width direction of a region of the free magnetic layer, in which the magnetization direction fluctuates depending on an external magnetic field, and the shortest path length of a direct current passing between the above-mentioned pair of electrode layers. A smaller region of the region of the free magnetic layer, in which the magnetization direction fluctuates depending on an external magnetic field, and a region of the free magnetic layer overlapping the shortest path of a direct current passing between the above-mentioned pair of electrode layers is referred to as a track-width region.

When the film thickness of the track-width region of the above-mentioned free magnetic layer is reduced, the magnetic field detection sensitivity of the magnetic sensing element is improved. However, when the film thickness of the track-width region of the above-mentioned free magnetic layer is less than 30 angstroms, instability of the playback waveform may be brought about, and noises are likely to be caused by thermal fluctuation.

On the other hand, when the film thickness of the region (both side regions) of the above-mentioned free magnetic layer overlapping the above-mentioned second antiferromagnetic layer is reduced, an exchange coupling magnetic field generated between the above-mentioned antiferromagnetic layer and the free magnetic layer is increased, and therefore, side leading can be reduced.

Since the present invention has the above-mentioned configuration, the track-width region of the above-mentioned free magnetic layer has a structure in which the above-mentioned first free magnetic layer and the second free magnetic layer overlap one another. Furthermore, a region, in which the second free magnetic layer of the first free magnetic layer and the second free magnetic layer is simply laminated, is provided as a layer under the above-mentioned second antiferromagnetic layer.

That is, in the present invention, the region of the above-mentioned free magnetic layer overlapping the above-mentioned second antiferromagnetic layer includes a region having a film thickness smaller than the film thickness of the track-width region.

Consequently, in the present invention, the film thickness of the region (both the side regions) of the above-mentioned free magnetic layer overlapping the above-mentioned second antiferromagnetic layer is reduced while the film thickness of the track-width region of the above-mentioned free magnetic layer is maintained, an exchange coupling magnetic field generated between the above-mentioned second antiferromagnetic layer and the free magnetic layer can be increased, and therefore, side leading can be reduced.

Static magnetic fields generated from both the side regions of the above-mentioned free magnetic layer can be reduced by reducing the film thicknesses of both the above-mentioned side regions.

Here, that the film thicknesses of both the side regions of the above-mentioned free magnetic layer are smaller than the film thickness of the track-width region of the above-mentioned free magnetic layer refers to that the film thickness of the track-width region of the above-mentioned free magnetic layer is larger than the film thicknesses of both the side regions of the above-mentioned free magnetic layer. Consequently, in the present invention, the magnetic flux density in the track-width region of the above-mentioned free magnetic layer resulting from the static magnetic fields generated from both the side regions of the above-mentioned free magnetic layer can be reduced, a dead zone which occurs in the above-mentioned track-width region can be reduced, and therefore, the magnetic field detection sensitivity is improved. Here, a dead zone in the above-mentioned track-width region refers to a region in which magnetization is unlikely to fluctuate even when an external magnetic field is applied.

Regarding the structure, when the above-mentioned second free magnetic layer is laminated on the first free magnetic layer, as in the present invention, successive film formation of the above-mentioned second free magnetic layer or the ferromagnetic layer laminated on the above-mentioned second free magnetic layer and the antiferromagnetic layer laminated thereon can be performed, and therefore, it becomes easy to generate an exchange coupling magnetic field required for sufficiently reducing side leading.

In the present invention, the above-mentioned first free magnetic layer and the above-mentioned second free magnetic layer can be provided as an integrated ferromagnetic layer.

A non-magnetic intermediate layer may be provided between the above-mentioned first free magnetic layer and the above-mentioned second free magnetic layer. Preferably, this non-magnetic intermediate layer is formed from one of Ru, Re, Pd, Os, Cr, Ir, Pt, Au, Cu and Rh or an alloy of at least two of them. In particular, more preferably, it is formed from Cu.

The present invention is in particular effective when the dimension in the above-mentioned track-width direction of the above-mentioned first free magnetic layer is 0.18 $\mu$m or less. When the above-mentioned dimension in the track-width direction of the above-mentioned first free magnetic layer having the structure according to the present invention exceeds 0.18 $\mu$m, a vertical bias magnetic field in the central portion of the track-width region becomes too weak, and instability of the playback waveform is brought about.

More preferably, the above-mentioned dimension in the track-width direction of the above-mentioned first free magnetic layer is 0.15 $\mu$m or less.

Preferably, [(the difference calculated by subtracting the film thickness of the above-mentioned free magnetic layer in the track-width region from the film thickness of the above-mentioned free magnetic layer in both side regions of the track-width region)/the film thickness of the above-mentioned free magnetic layer in the track-width region]×100 (%) is within the range of −80% or more, but less than 0%.

Preferably, the film thickness of the above-mentioned second free magnetic layer in both side regions of the track-width region is 10 angstroms or more, but 50 angstroms or less, and the film thickness of the above-mentioned free magnetic layer in the track-width region is 30 angstroms or more, but 50 angstroms or less.

In the present invention, for example, when the above-mentioned second antiferromagnetic layer is directly laminated on the above-mentioned second free magnetic layer, the above-mentioned second antiferromagnetic layer is laminated on the track-width region of the above-mentioned second free magnetic layer as well, and the film thickness of the above-mentioned second antiferromagnetic layer on the above-mentioned track-width region is smaller than the thickness of the above-mentioned second antiferromagnetic layer in both side regions located on both sides thereof.

More preferably, the above-mentioned second antiferromagnetic layer provided on the track-width region of the above-mentioned second free magnetic layer has a non-antiferromagnetic property, and both the side regions of the above-mentioned second antiferromagnetic layer have an antiferromagnetic property.

In this manner, no exchange coupling magnetic field is generated between the track-width region of the above-mentioned free magnetic layer and the above-mentioned second antiferromagnetic layer, and the magnetization of the track-width region of the above-mentioned free magnetic layer is not strongly pinned in the track-width direction. On the other hand, since both the side regions of the above-mentioned second antiferromagnetic layer have an antiferromagnetic property, both the side regions of the above-mentioned second antiferromagnetic layer are transformed into ordered states by magnetic annealing, an appropriate magnitude of exchange coupling magnetic fields are generated between both the side regions of the above-mentioned second antiferromagnetic layer and both the side regions of the free magnetic layer, and thereby, both the side regions of the above-mentioned free magnetic layer become in the condition of being strongly pinned in the track-width direction.

Preferably, the second antiferromagnetic layer is provided on the track-width region of the above-mentioned second free magnetic layer so as to have a film thickness of 50 angstroms or less, or no antiferromagnetic layer is provided on the track-width region of the above-mentioned free magnetic layer.

When the film thickness of the second antiferromagnetic layer provided on the track-width region of the above-mentioned free magnetic layer is 50 angstroms or less, no exchange coupling magnetic field is generated between the above-mentioned second antiferromagnetic layer and the track-width region of the free magnetic layer. Even when an exchange coupling magnetic field is generated, the value thereof is small.

The spacing in the track-width direction between the inner end surfaces of both the above-mentioned side regions of the above-mentioned second antiferromagnetic layer may be smaller than or equal to the dimension in the track-width direction of the above-mentioned first free magnetic layer.

In this configuration, the above-mentioned second antiferromagnetic layer can be overlapped with both the side regions of the above-mentioned first free magnetic layer as well, and therefore, this configuration is suited for reducing side leading.

Alternatively, the spacing in the track-width direction between the inner end surfaces of both the above-mentioned side regions of the second antiferromagnetic layer may be larger than the dimension in the track-width direction of the above-mentioned first free magnetic layer.

This configuration is suited for preventing formation of a dead zone in the track-width region of the above-mentioned free magnetic layer due to an exchange coupling magnetic field generated between the above-mentioned second antiferromagnetic layer and the above-mentioned second free magnetic layer. At this time, preferably, the track-width dimension is defined by the spacing in the track-width direction between a pair of electrode layers provided on both sides of the above-mentioned multilayer film.

Preferably, the above-mentioned second antiferromagnetic layer is directly laminated on the above-mentioned second free magnetic layer. At this time, successive film formation of the above-mentioned second antiferromagnetic layer can be performed on the above-mentioned second free magnetic layer.

Alternatively, in the magnetic sensing element of the present invention, a pair of the second antiferromagnetic layers having a spacing may be provided on the above-mentioned second free magnetic layer with a third antiferromagnetic layer therebetween.

In the present invention, as described above, the above-mentioned third antiferromagnetic layer may be provided on the free magnetic layer, and the above-mentioned second antiferromagnetic layers may be provided on both side regions of this third antiferromagnetic layer. Consequently, the above-mentioned second antiferromagnetic layer and the above-mentioned third antiferromagnetic layer are combined so that antiferromagnetic layers having a large thickness is provided on both the side regions of the above-mentioned free magnetic layer. Both the side regions of the above-mentioned free magnetic layer are in a condition of being appropriately pinned in the track-width direction by exchange coupling magnetic fields generated between the resulting antiferromagnetic layer and the free magnetic layer. On the other hand, the track-width region of the above-mentioned free magnetic layer is weakly brought into a single domain, so that magnetic reversal can be brought about with respect to an external magnetic field.

In the present invention, a non-magnetic intermediate layer may be laminated between the third antiferromagnetic layer and the second antiferromagnetic layer.

The above-mentioned non-magnetic intermediate layer is provided for preventing oxidation of the above-mentioned third antiferromagnetic layer due to exposure to air.

In the present invention, preferably, the central portion of the above-mentioned third antiferromagnetic layer has a non-antiferromagnetic property, and both the side regions of the above-mentioned third antiferromagnetic layer have an antiferromagnetic property.

When the central portion of the above-mentioned third antiferromagnetic layer has a non-antiferromagnetic property, the central portion of the above-mentioned third antiferromagnetic layer is unlikely to be transformed into an ordered state by even magnetic annealing. Consequently, no exchange coupling magnetic field is generated between the central portion of the above-mentioned third antiferromagnetic layer and the track-width region of the above-mentioned free magnetic layer, and therefore, the magnetization of the track-width region of the above-mentioned free magnetic layer is not strongly pinned in the track-width direction. On the other hand, both the side regions of the above-mentioned third antiferromagnetic layer are combined with the above-mentioned second antiferromagnetic layers provided thereon to become like an integrated antiferromagnetic layer, and therefore, transformation into ordered states are likely to occur by magnetic annealing. Consequently, exchange coupling magnetic fields are generated between both the side regions of the above-mentioned third antiferromagnetic layer and both the side regions of the free magnetic layer, and thereby, both the side regions of the free magnetic layer can be strongly pinned in the track-width direction.

In the present invention, preferably, the film thickness of the above-mentioned third antiferromagnetic layer is 5 angstroms or more, but 50 angstroms or less.

In the present invention, successive film formation of the above-mentioned third antiferromagnetic layer can be performed on the above-mentioned second free magnetic layer.

Alternatively, in the magnetic sensing element of the present invention, a pair of the above-mentioned second antiferromagnetic layers having a spacing in the track-width direction may be provided on the above-mentioned second free magnetic layer through a pair of ferromagnetic layers provided so as to have a spacing in the track-width direction.

In the present invention, successive film formation of the above-mentioned second antiferromagnetic layer can be performed on the above-mentioned ferromagnetic layer.

Preferably, the total film thickness of the film thickness of the above-mentioned ferromagnetic layer and the film thickness of the above-mentioned second free magnetic layer is smaller than the total film thickness of the film thickness of the above-mentioned first free magnetic layer and the film thickness of the above-mentioned second free magnetic layer in order to suppress static magnetic fields which enter into the track-width region of the above-mentioned free magnetic layer from both the side regions and to generate large exchange coupling magnetic field between the above-mentioned second antiferromagnetic layer and the above-mentioned ferromagnetic layer.

A non-magnetic intermediate layer may be laminated between the above-mentioned second free magnetic layer and the above-mentioned ferromagnetic layer.

The above-mentioned non-magnetic intermediate layer is provided for preventing oxidation of the above-mentioned second free magnetic layer due to exposure to air.

In the present invention, the above-mentioned non-magnetic intermediate layer may be formed from at least one noble metal selected from the group consisting of Ru, Re, Pd, Os, Ir, Pt, Au, Rh and Cu, or be formed from Cr.

These materials are unlikely to oxidize, or are materials in which oxidization is unlikely to proceed in the film thickness direction. Consequently, a sufficient effect of preventing oxidation is exerted even when the film thickness of the non-magnetic intermediate layer is small. Therefore, even when an oxide layer is formed on the surface of the above-mentioned non-magnetic intermediate layer during the manufacturing process of the magnetic sensing element, the above-mentioned oxide layer can be removed by low-energy ion milling, and thereby, degradation of the antiferromagnetic property of the above-mentioned third antiferromagnetic layer provided as a layer under the above-mentioned non-magnetic intermediate layer and the ferromagnetic property of the above-mentioned second free magnetic layer can be prevented.

The spacing in the track-width direction between the above-mentioned pair of second antiferromagnetic layers provided on the above-mentioned third antiferromagnetic layer or the above-mentioned ferromagnetic layer may be smaller than or equal to the dimension in the track-width direction of the above-mentioned first free magnetic layer.

In this configuration, the above-mentioned second antiferromagnetic layer can be overlapped with both the side regions of the above-mentioned first free magnetic layer as well, and therefore, this configuration is suited for reducing side leading.

Alternatively, the spacing in the track-width direction between the above-mentioned pair of second antiferromagnetic layers may be larger than the dimension in the track-width direction of the above-mentioned first free magnetic layer.

This configuration is suited for preventing formation of a dead zone in the track-width region of the above-mentioned free magnetic layer due to an exchange coupling magnetic field generated between the above-mentioned second antiferromagnetic layer and the above-mentioned free magnetic layer. At this time, preferably, the track-width dimension is defined by the spacing in the track-width direction between a pair of electrode layers provided on both sides of the above-mentioned multilayer film.

A method for manufacturing a magnetic sensing element of the present invention includes the following steps of (a) forming a multilayer film in which a first antiferromagnetic layer, a pinned magnetic layer, a non-magnetic material layer and a first free magnetic layer are laminated on a substrate in that order, (b) removing both the end portions in the track-width direction of the above-mentioned multilayer film, (c) forming electrode layers on both sides in the track-width direction of the above-mentioned multilayer film, (d) laminating a second free magnetic layer having a dimension in the track-width direction larger than that of the first free magnetic layer on the above-mentioned first free magnetic layer and (e) forming a second antiferromagnetic layer as a layer above the second free magnetic layer.

By using the above-mentioned manufacturing method, a magnetic sensing element can be manufactured, in which the region of the above-mentioned free magnetic layer overlapping the above-mentioned second antiferromagnetic layer includes a region having a film thickness smaller than the film thickness of the track-width region.

That is, the magnetic sensing element can be manufactured, in which the film thickness of the region (both the side regions) of the above-mentioned free magnetic layer overlapping the above-mentioned second antiferromagnetic layer is reduced while the film thickness of the track-width region of the above-mentioned free magnetic layer is maintained, an exchange coupling magnetic field generated between the above-mentioned second antiferromagnetic layer and the free magnetic layer can be increased, and therefore, side leading can be reduced.

The magnetic sensing element formed using the present invention can reduce static magnetic fields generated from both the side regions of the above-mentioned free magnetic layer. Furthermore, the magnetic flux density in the track-width region of the above-mentioned free magnetic layer resulting from the above-mentioned static magnetic fields can be reduced, a dead zone which occurs in the above-mentioned track-width region can be reduced, and therefore, the magnetic field detection sensitivity is improved.

It is preferable that a non-magnetic intermediate layer is laminated on the above-mentioned first free magnetic layer in the above-mentioned step (a) and that a step of removing a part of or all of the above-mentioned non-magnetic intermediate layer is included between the above-mentioned step (c) and the above-mentioned step (d), because oxidation of the above-mentioned first free magnetic layer can be prevented.

In the method for manufacturing a magnetic sensing element of the present invention, after the second free magnetic layer is formed, successive film formation of the second antiferromagnetic layer may be performed in the step (d), and the step of (f) removing the above-mentioned second antiferromagnetic layer on the track-width region of the above-mentioned free magnetic layer so as to make the film thickness of the above-mentioned second antiferromagnetic layer on the above-mentioned track-width region smaller than the film thickness of the above-mentioned second antiferromagnetic layer located on both sides thereof may be included in place of the above-mentioned step (e).

In the present invention, successive film formation of the above-mentioned second antiferromagnetic layer to be laminated on the above-mentioned second free magnetic layer can be performed, and it becomes easy to generate an exchange coupling magnetic field required for sufficiently reducing side leading.

Preferably, the central portion of the above-mentioned second antiferromagnetic layer provided on the above-mentioned track-width region is made to have a non-antiferromagnetic property, and the above-mentioned second antiferromagnetic layers in both side regions of the above-mentioned central portion are made to have an antiferromagnetic property through the above-mentioned step (f). Specifically, the film thickness of the central portion of the second antiferromagnetic layer is preferably made to be 50 angstroms or less in the above-mentioned step (f).

When the spacing in the track-width direction between the inner end surfaces of both the side regions of the above-mentioned second antiferromagnetic layer is made smaller than or equal to the dimension in the track-width direction of the above-mentioned first free magnetic layer in the above-mentioned step (f), a magnetic sensing element suited for reducing side leading can be manufactured.

Alternatively, when the spacing in the track-width direction between the inner end surfaces of both the side regions of the above-mentioned second antiferromagnetic layer is made larger than the dimension in the track-width direction of the above-mentioned first free magnetic layer in the above-mentioned step (f), a magnetic sensing element suited for improving the magnetic field detection sensitivity (playback output) can be manufactured.

The method for manufacturing a magnetic sensing element of the present invention may includes the steps of (g) successively forming a third antiferromagnetic layer on the above-mentioned second free magnetic layer between the above-mentioned step (d) and the above-mentioned step (e), and (h) forming a pair of the above-mentioned second antiferromagnetic layers having a spacing in the track-width direction on the above-mentioned third antiferromagnetic layer in place of the above-mentioned step (e).

In the present invention, successive film formation of the third antiferromagnetic layer to be laminated on the above-mentioned second free magnetic layer can be performed, and it becomes easy to generate an exchange coupling magnetic field required for sufficiently reducing side leading.

Preferably, the above-mentioned third antiferromagnetic layer is formed to have a film thickness providing a non-antiferromagnetic property in the above-mentioned step (g). In this manner, after the above-mentioned second antiferromagnetic layer is formed, no exchange coupling magnetic field is generated between the central portion of the above-mentioned third antiferromagnetic layer and the track-width region of the above-mentioned free magnetic layer. Even when an exchange coupling magnetic field is generated, it can be made weak. On the other hand, an exchange coupling magnetic field is generated between both the side regions of the above-mentioned third antiferromagnetic layer and both the side regions of the free magnetic layer, and thereby, both the side regions of the above-mentioned free magnetic layer can be strongly pinned in the track-width direction.

Specifically, the film thickness of the above-mentioned third antiferromagnetic layer is preferably made to be 5 angstroms or more, but 50 angstroms or less in the above-mentioned step (g).

It is preferable to include the steps of (i) laminating a non-magnetic intermediate layer on the above-mentioned third antiferromagnetic layer after the above-mentioned step (g), and (j) removing a part of or all of the above-mentioned non-magnetic intermediate layer, followed by laminating the above-mentioned second antiferromagnetic layer in the above-mentioned step (h), because oxidation of the third antiferromagnetic layer can be prevented.

Alternatively, the method for manufacturing a magnetic sensing element of the present invention includes the step of (k) forming a pair of ferromagnetic layers having a spacing in the track-width direction on the above-mentioned second free magnetic layer, and successively forming a pair of the above-mentioned second antiferromagnetic layers having a spacing in the track-width direction on the above-mentioned pair of ferromagnetic layers in place of the above-mentioned step (e).

In the present invention, successive film formation of the second antiferromagnetic layer to be laminated on the above-mentioned ferromagnetic layer can be performed, and it becomes easy to generate an exchange coupling magnetic field required for sufficiently reducing side leading.

Preferably, the total film thickness of the film thickness of the above-mentioned ferromagnetic layer and the film thickness of the above-mentioned second free magnetic layer is made smaller than the total film thickness of the film thickness of the above-mentioned first free magnetic layer and the film thickness of the above-mentioned second free magnetic layer in the above-mentioned step (k).

It is preferable that a non-magnetic intermediate layer is laminated on the above-mentioned second free magnetic layer, and the above-mentioned ferromagnetic layer is laminated after a part of or all of the above-mentioned non-magnetic intermediate layer is removed in the above-mentioned step (k) because oxidation of the above-mentioned second free magnetic layer can be prevented.

In the present invention, preferably, the above-mentioned non-magnetic intermediate layer is formed from, e.g. at least one noble metal selected from the group consisting of Ru, Re, Pd, Os, Ir, Pt, Au, Rh and Cu, or is formed from Cr in the above-mentioned step (i) or in the above-mentioned step (k).

These materials are unlikely to oxidize, or are materials in which oxidization is unlikely to proceed in the film thickness direction. Consequently, a sufficient effect of preventing oxidation is exerted even when the film thickness of the non-magnetic intermediate layer is small. Therefore, even when an oxide layer is formed on the surface of the above-mentioned non-magnetic intermediate layer during the manufacturing process of the magnetic sensing element, the above-mentioned oxide layer can be removed by low-energy ion milling, and thereby, degradation of the antiferromagnetic property of the above-mentioned third antiferromagnetic layer provided as a layer under the above-mentioned non-magnetic intermediate layer and the ferromagnetic property of the above-mentioned second free magnetic layer can be prevented.

When the spacing in the track-width direction between the above-mentioned pair of second antiferromagnetic layers is made smaller than or equal to the dimension in the track-width direction of the above-mentioned first free magnetic layer in the above-mentioned step (h) or in the above-mentioned step (k), a magnetic sensing element suited for reducing side leading can be manufactured.

When the spacing in the track-width direction between the above-mentioned pair of second antiferromagnetic layers is made larger than the dimension in the track-width direction of the above-mentioned first free magnetic layer in the above-mentioned step (h) or in the above-mentioned step (k), a magnetic sensing element suited for improving the magnetic field detection sensitivity (playback output) can be manufactured.

DESCRIPTION OF THE PREFERRED EMBODIMENTS

Figure 1:
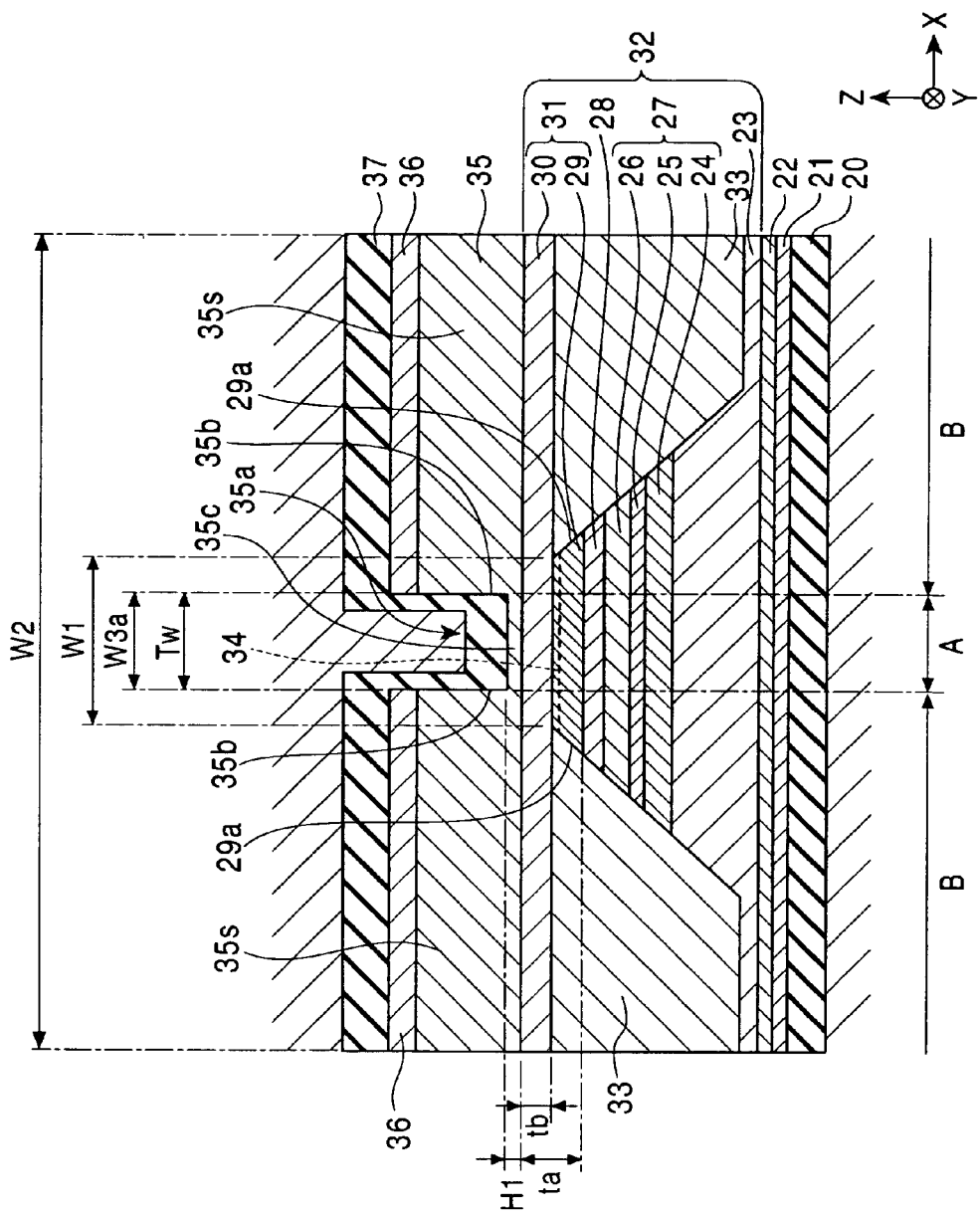
FIG. 1 is a partial sectional view of the structure of a magnetic sensing element according to a first embodiment of the present invention, viewed from the side of a surface facing a recording medium.

FIG. 1 is a partial sectional view of a magnetic sensing element according to a first embodiment of the present invention, viewed from the side of a surface facing a recording medium.

Reference numerals 20 and 37 shown in FIG. 1 denote gap layers. A magnetic sensing element of the present invention is provided between these gap layers 20 and 37. Shield layers (not shown in the drawing) made of a magnetic material are provided on the top and bottom of the gap layers 20 and 37, and the magnetic sensing element, the gap layers and the shield layers are collectively referred to as an MR head.

The MR head is for playing back an external signal recorded on a recording medium. In the present invention, an inductive head for recording may be laminated on the MR head. The shield layer (upper shield layer) provided on the upper side of the magnetic sensing element may double as a lower core layer of the inductive head.

The MR head is provided on a trailing end surface of a slider made of alumina-titanium carbide ($Al_2O_3$—TiC), for example. The slider is joined to a support member which is made of, e.g. stainless steel, and which can undergo elastic deformation on the reverse surface side of a surface facing a recording medium, and thereby, a magnetic head device is constructed.

The surface facing the recording medium is, for example, a plane perpendicular to a film surface of a thin film constituting the magnetic sensing element and parallel to the magnetization direction of the free magnetic layer of the magnetic sensing element when no external magnetic field is applied. In FIG. 1, the surface facing the recording medium is a plane parallel to the X-Z plane.

When the magnetic sensing element is used for a flying magnetic head, the surface facing the recording medium refers to a so-called ABS surface.

As shown in FIG. 1, a substrate 21 is provided on the gap layer 20, and a seed layer 22 is provided on the substrate 21.

Preferably, the substrate layer 21 is formed from at least one element selected from the group consisting of Ta, Hf, Nb, Zr, Ti, Mo and W. The seed layer 22 is formed from a NiFeCr alloy, Cr or the like. Since the seed layer 22 is provided, the crystal particle diameter of each layer provided thereon is increased, and thereby, e.g. improvement of the rate of change of resistance can be achieved.

A first antiferromagnetic layer 23 is provided on the seed layer 22. Preferably, the first antiferromagnetic layer 23 is formed from an antiferromagnetic material containing an element X (where X represents at least one element selected from the group consisting of Pt, Pd, Ir, Rh, Ru and Os) and Mn. For example, the first antiferromagnetic layer 23 is formed from a PtMn alloy or the like.

In the present invention, alternatively, the first antiferromagnetic layer 23 may be formed from an X—Mn—X' alloy (where an element X' represents at least one element selected from the group consisting of Ne, Ar, Kr, Xe, Be, B, C, N, Mg, Al, Si, P, Ti, V, Cr, Fe, Co, Ni, Cu, Zn, Ga, Ge, Zr, Nb, Mo, Ag, Cd, Ir, Sn, Hf, Ta, W, Re, Au, Pb and rare-earth elements).

Preferably, the compositional ratio of the element X or the elements X+X' is 45 (at %) or more, but 60 (at %) or less.

A pinned magnetic layer 27 is provided on the first antiferromagnetic layer 23. In the present embodiment, the pinned magnetic layer 27 is formed to have a laminated ferrimagnetic structure.

As shown in FIG. 1, the pinned magnetic layer 27 is provided by laminating a magnetic layer 24, a non-magnetic intermediate layer 25 and a magnetic layer 26 in that order from the bottom. Here, the magnetic layers 24 and 26 are formed from a magnetic material, e.g. a CoFe alloy, a CoFeNi alloy, Co or a NiFe alloy. Preferably, the non-magnetic intermediate layer 25 is formed from a non-magnetic conductive material, e.g. Ru, Rh, Ir, Cr, Re or Cu.

Regarding the pinned magnetic layer 27 shown in FIG. 1, the magnetic layer 24 is pinned, e.g. in the Y direction shown in the drawing by an exchange coupling magnetic field generated between the first antiferromagnetic layer 23 and the magnetic layer 24. On the other hand, the magnetic layer 26 is magnetized, e.g. in the direction opposite to the Y direction shown in the drawing by a coupling magnetic field based on an RKKY interaction generated between the magnetic layer 24 and the magnetic layer 26.

That is, in the laminated ferrimagnetic structure, the magnetic layer 24 and the magnetic layer 26 are magnetized to become in the condition of being antiparallel to each other. In order to construct the laminated ferrimagnetic structure, the magnetic moments (saturation magnetization Ms×film thickness t) of the magnetic layer 24 and the magnetic layer 26 on a unit area basis must be differentiated. For example, when the magnetic layer 24 and the magnetic layer 26 are formed from the same material, the magnetic layer 24 and the magnetic layer 26 are formed to have different film thicknesses.

Each of the magnetic layer 24 and the magnetic layer 26 is formed to have a film thickness of 10 angstroms to 70 angstroms. The non-magnetic intermediate layer 25 is formed to have a film thickness of 3 angstroms to 10 angstroms.

The pinned magnetic layer 27 may be formed to have a one-layer structure using any one of the above-mentioned magnetic materials or a two-layer structure composed of a layer made of any one of the above-mentioned magnetic materials and a diffusion prevention layer, e.g. a Co layer.

A non-magnetic material layer 28 is provided on the pinned magnetic layer 27.

The non-magnetic material layer 28 is a layer which prevents magnetic connection of the pinned magnetic layer 27 and a free magnetic layer and through which a sense current passes, and preferably is formed from a non-magnetic material, e.g. Cu, Cr, Au or Ag, having electrical conductivity. In particular, it is preferably formed from Cu.

The non-magnetic material layer 28 is formed to have a film thickness of, e.g. 18 angstroms to 30 angstroms.

A free magnetic layer 31 is laminated on the non-magnetic material layer 28.

In the free magnetic layer 31, a second free magnetic layer 30 having a dimension W2 in the track-width direction (the X direction shown in the drawing) larger than that of a first free magnetic layer 29 is laminated on the first free magnetic layer 29 having a dimension W1 in the track-width direction.

The first free magnetic layer 29 and the second free magnetic layer 30 are formed from, e.g. a NiFe alloy, Co, a CoFeNi alloy, a CoFe alloy or a CoNi alloy, and in particular, are preferably formed from a NiFe alloy, a CoFe alloy or a CoFeNi alloy. Preferably, the first free magnetic layer 29 is formed to have a two-layer structure, and a Co film or a CoFe alloy is formed on the side facing the non-magnetic material layer. In this manner, diffusion of metal elements and the like at the interface to the non-magnetic material layer can be prevented, and the rate of change of resistance (ΔR/R) can be increased.

Each of the first free magnetic layer 29 and the second free magnetic layer 30 is formed to have a film thickness in the order of 10 angstroms to 60 angstroms. Preferably, the total film thickness of the first free magnetic layer 29 and the second free magnetic layer 30 is 70 angstroms or less.

The side end surface 29a of the first free magnetic layer 29 is a surface continued from the side end surfaces of the first antiferromagnetic layer 23, the pinned magnetic layer 27 and the non-magnetic material layer 28.

The first antiferromagnetic layer 23, the pinned magnetic layer 27, the non-magnetic material layer 28 and the free magnetic layer 31 constitute a multilayer film 32.

First electrode layers 33 and 33 are provided in contact with both side surfaces of the first antiferromagnetic layer 23, the pinned magnetic layer 27, the non-magnetic material layer 28 and the first free magnetic layer 29. The first electrode layers are for supplying a direct current to the multilayer film 32, and are formed from, e.g. α—Ta, Au, Cr, Cu (copper), Rh, Ir, Ru or W (tungsten).

The direct current supplied from the first electrode layers 33 and 33 passes in the direction parallel to the film surface of each of the layers constituting the multilayer film 32. Such a magnetic sensing element is referred to as a spin-valve magnetic sensing element of a CIP (current in the plane) type.

In the magnetic sensing element of the present embodiment, since the first electrode layers 33 and 33 are provided in contact with both side surfaces of the multilayer film 32, the current can be directly passed through the multilayer film 32 without through a second antiferromagnetic layer 35 having high resistivity, the loss of current can be reduced, and thereby, the direct current can be efficiently supplied to the multilayer film 32.

Successive film formation of the second antiferromagnetic layer 35 is performed on the second free magnetic layer 30.

Preferably, the second antiferromagnetic layer 35 is formed from an antiferromagnetic material similar to that for the first antiferromagnetic layer 23. Specifically, the second antiferromagnetic layer 35 is preferably formed from an antiferromagnetic material containing an element X (where X represents at least one element selected from the group consisting of Pt, Pd, Ir, Rh, Ru and Os) and Mn. For example, the second antiferromagnetic layer 35 is formed from a PtMn alloy or the like.

In the present invention, alternatively, the second antiferromagnetic layer 35 may be formed from an X—Mn—X' alloy (where an element X' represents at least one element selected from the group consisting of Ne, Ar, Kr, Xe, Be, B, C, N, Mg, Al, Si, P, Ti, V, Cr, Fe, Co, Ni, Cu, Zn, Ga, Ge, Zr, Nb, Mo, Ag, Cd, Ir, Sn, Hf, Ta, W, Re, Au, Pb and rare-earth elements).

Preferably, the compositional ratio of the above-mentioned element X or the elements X+X' is 45 (at %) or more, but 60 (at %) or less.

As shown in FIG. 1, a concave portion 35a is provided at the central portion 35c of the second antiferromagnetic layer 35 located on a track-width region A of the free magnetic layer 31, from the surface above the location facing the multilayer film 32 in the film thickness direction (the Z direction shown in the drawing) toward the direction of the above-mentioned multilayer film 32.

The film thickness H1 of the second antiferromagnetic layer at the location, in which the concave portion 35a is provided, is 10 angstroms to 50 angstroms, for example. In this manner, the central portion 35c provided with the concave portion 35a of the second antiferromagnetic layer 35 is formed to have a very small film thickness H1, and therefore, is in the condition in which almost no exchange coupling magnetic field is generated between the second antiferromagnetic layer 35 formed to have the film thickness H1 and the free magnetic layer 31. That is, the second antiferromagnetic layer 35 provided on the track-width region A of the second free magnetic layer 30 has a non-antiferromagnetic property. Consequently, the magnetization of the track-width region A of the free magnetic layer 31 is not strongly pinned in the track-width direction, and the track-width region A of the free magnetic layer 31 is in the condition of being weakly magnetized to the extent that the magnetization can be fluctuated by an external magnetic field (recording signal magnetic field).

On the other hand, both side regions 35s and 35s of the concave portion 35a (both side regions 35s and 35s of the central portion 35c) of the second antiferromagnetic layer 35 have a film thickness of 80 angstroms to 300 angstroms, and therefore, have an antiferromagnetic property. That is, both the side regions 35s and 35s of the second antiferromagnetic layer 35 are transformed into ordered states by magnetic annealing, an appropriate magnitude of exchange coupling magnetic field is generated between both the side regions 35s and 35s of the second antiferromagnetic layer 35 and both the side regions B and B of the track-width region A of the free magnetic layer 31 (the second free magnetic layer 30), and thereby, both the side regions B and B of the free magnetic layer 31 become in the condition of being strongly pinned in the track-width direction.

As shown in FIG. 1, second electrode layers 36 and 36 are provided on the second antiferromagnetic layer 35. The second electrode layers 36 and 36 are formed from, e.g. α—Ta, Au, Cr, Cu (copper), Rh, Ir, Ru or W (tungsten).

The second electrode layers 36 and 36 are subsidiarily provided when the first electrode layers 33 and 33 alone cannot sufficiently supply a direct current. Consequently, the second electrode layers 36 and 36 may not be provided in the present invention. When the second electrode layers 36 and 36 are not provided, the spacing between the above-mentioned upper and lower shield layers can be reduced, and therefore, reduction in gap can be accelerated.

The features of the present embodiment will be described below.

In the magnetic sensing element shown in FIG. 1, the free magnetic layer 31 is constructed by laminating the second free magnetic layer 30 having a dimension W2 in the track-width direction on the first free magnetic layer 29 having a dimension W1 in the track-width direction, while the dimension W2 is larger than the dimension W1.

According to the above-mentioned configuration, the track-width region A, in which the magnetization direction can be fluctuated by an external magnetic field, of the free magnetic layer 31 has a lamination structure of the first free magnetic layer 29 and the second free magnetic layer 30. Furthermore, regions, in which the second free magnetic layer 30 of the first free magnetic layer 29 and the second free magnetic layer 30 is simply laminated, are provided as layers under both the side regions 35s and 35s of the second antiferromagnetic layer 35.

That is, both the side regions B and B of the free magnetic layer 31 overlapping the second antiferromagnetic layer 35 includes regions having a film thickness tb smaller than the film thickness ta of the track-width region A.

When the film thickness of the track-width region A of the free magnetic layer 31 is reduced, the magnetic field detection sensitivity of the magnetic sensing element is improved. However, when the film thickness of the track-width region A of the free magnetic layer 31 is less than 30 angstroms, instability of the playback waveform may be brought about, and noises are likely to be caused by thermal fluctuation.

In the present embodiment, the film thicknesses tb of both the side regions B and B of the free magnetic layer 31 overlapping both the side regions 35s and 35s of the second antiferromagnetic layer 35 can be reduced while the film thickness ta of the track-width region A of the free magnetic layer 31 is maintained, so that an exchange coupling magnetic field generated between the second antiferromagnetic layer 35 and both the side regions B and B of the free magnetic layer 31 can be increased, and therefore, side leading can be reduced.

Static magnetic fields generated from both the side regions B and B of the free magnetic layer 31 can be reduced by reducing the film thicknesses tb of both the side regions B and B.

Here, that the film thicknesses tb of both the side regions B and B of the free magnetic layer 31 are smaller than the film thickness ta of the track-width region A of the free magnetic layer 31 refers to that the film thickness ta of the track-width region A of the free magnetic layer 31 is larger than the film thicknesses tb of both the side regions B and B of the free magnetic layer 31. Consequently, the magnetic flux density in the track-width region A of the free magnetic layer 31 resulting from the static magnetic fields generated from both the side regions B and B of the free magnetic layer 31 can be reduced, a dead zone which occurs in the track-width region A of the free magnetic layer 31 can be reduced, and therefore, the magnetic field detection sensitivity is improved. Here, a dead zone in the free magnetic layer 31 refers to a region in which magnetization is unlikely to fluctuate even when an external magnetic field is applied.

When the film thickness ta of the track-width region A of the free magnetic layer 31 exceeds 70 angstroms, the playback sensitivity is reduced. Therefore, preferably, the film thickness ta is 70 angstroms or less.

When the film thicknesses tb of both the side regions B and B of the free magnetic layer 31 are less than 10 angstroms, exchange coupling magnetic fields between the second antiferromagnetic layer 35 and both the side regions B and B become small. Therefore, preferably, the film thicknesses tb are 10 angstroms or more.

Regarding the structure, when the second free magnetic layer 30 is laminated on the first free magnetic layer 29, successive film formation of the second free magnetic layer 30 and the second antiferromagnetic layer 35 can be performed, and therefore, it becomes easy to generate an exchange coupling magnetic field required for sufficiently reducing side leading.

Preferably, the dimension W1 in the track-width direction of the first free magnetic layer 29 is 0.18 μm or less. When the dimension W1 in the track-width direction of the first free magnetic layer 29 having the structure according to the present invention exceeds 0.18 μm, a vertical bias magnetic field in the track-width region A becomes too weak, and instability of the playback waveform is brought about.

More preferably, the dimension W1 in the track-width direction of the first free magnetic layer 29 is 0.15 μm or less.

The first free magnetic layer 29 and the second free magnetic layer 30 may be provided as an integrated ferromagnetic layer. A non-magnetic intermediate layer 34 indicated by a dotted line may be provided between the first free magnetic layer 29 and the second free magnetic layer 30. Preferably, the non-magnetic intermediate layer 34 is formed from one of Ru, Rh, Ir, Cr, Re, Cu, Au, Pd, Os and Pt or an alloy of at least two of them. In particular, it is preferably formed from Cu.

Even when the non-magnetic intermediate layer 34 indicated by a dotted line is provided between the first free magnetic layer 29 and the second free magnetic layer 30, if the film thickness thereof is 0.2 angstroms to 5 angstroms, the first free magnetic layer 29 and the second free magnetic layer 30 are ferromagnetically coupled, and therefore, perform a function as an integrated ferromagnetic layer.

Furthermore, the first free magnetic layer 29 may have a synthetic, ferrimagnetic free structure in which a non-magnetic intermediate layer is sandwiched between ferromagnetic layers.

In the magnetic sensing element shown in FIG. 1, the spacing W3a in the track-width direction between the inner end surfaces 35b and 35b of both the side regions 35s and 35s, which exhibit an antiferromagnetic property, of the second antiferromagnetic layer 35 is smaller than or equal to the dimension W1 in the track-width direction of the first free magnetic layer 29.

In this configuration, both the side regions 35s and 35s, which exhibit an antiferromagnetic property, of the second antiferromagnetic layer 35 can also be overlapped with both the side regions B and B of the track-width region A of the first free magnetic layer 29, and therefore, the magnetic sensing element becomes suitable for reducing side leading.

In the magnetic sensing element shown in FIG. 1, the track-width region A is a region sandwiched by both the side regions 35s and 35s, which exhibit an antiferromagnetic property, of the second antiferromagnetic layer 35. Consequently, the optical track-width dimension Tw becomes equal to the spacing W3a in the track-width direction between the inner end surfaces 35b and 35b.

Therefore, the dimension W1 in the track-width direction of the first free magnetic layer 29 is larger than the optical track-width dimension Tw.

Figure 2:
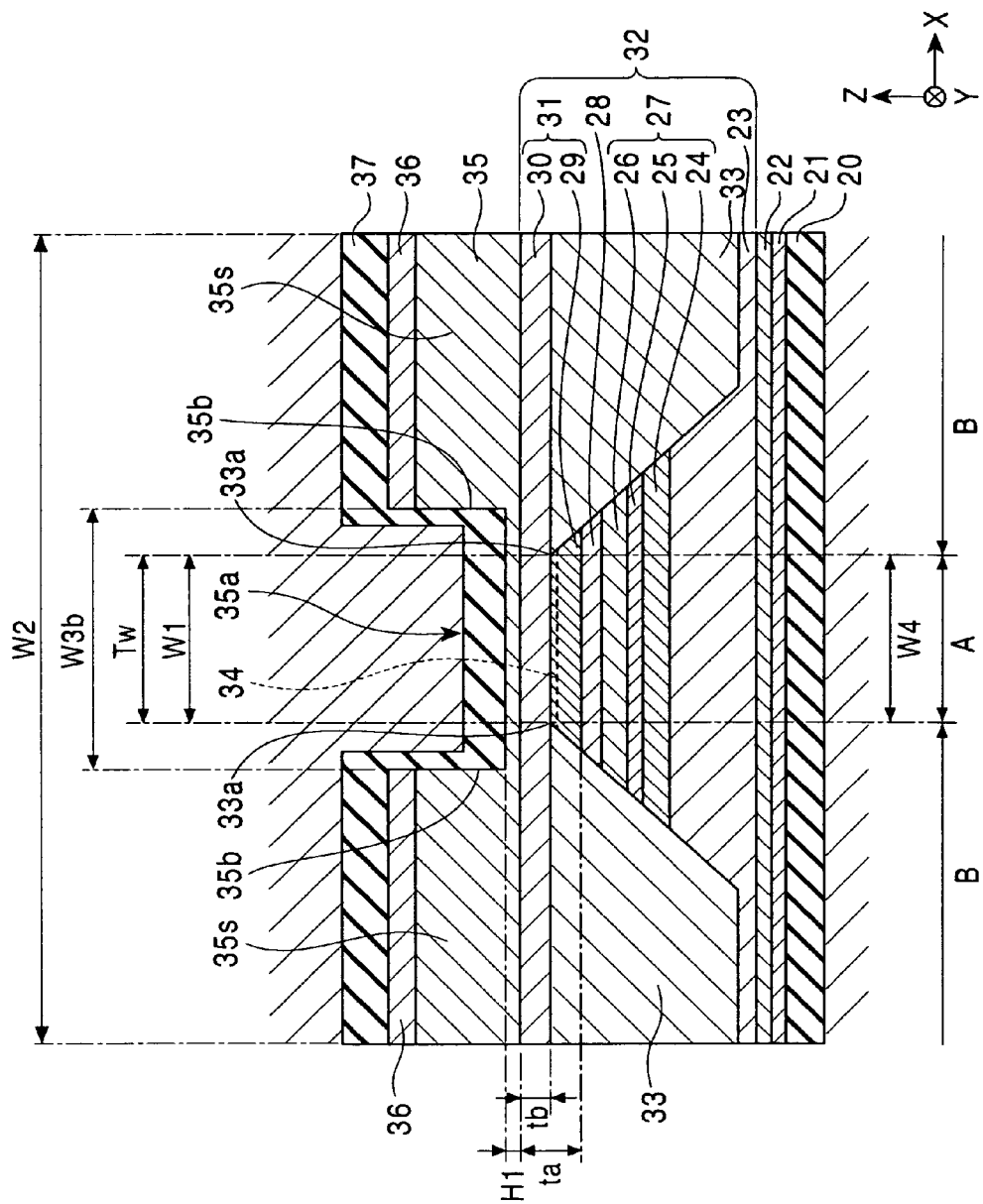
FIG. 2 is a partial sectional view of the structure of a magnetic sensing element according to a second embodiment of the present invention, viewed from the side of a surface facing a recording medium.

A magnetic sensing element shown in FIG. 2 differs from the magnetic sensing element shown in FIG. 1 simply in that the spacing W3b in the track-width direction between the inner end surfaces 35b and 35b of both the side regions 35s and 35s, which exhibit an antiferromagnetic property, of the second antiferromagnetic layer 35 is larger than the dimension W1 in the track-width direction of the first free magnetic layer 29.

Since the material, the shape and the film thickness of each layer, except for the second antiferromagnetic layer 35, of the magnetic sensing element shown in FIG. 2 are the same as those of each layer indicated by the same reference numeral shown in FIG. 1, further explanations thereof will not be provided.

In the magnetic sensing element shown in FIG. 2, the track-width region A is a region sandwiched by inner tip portions 33a and 33a of first electrode layers 33 and 33. Consequently, the optical track-width dimension Tw becomes equal to the spacing W4 in the track-width direction between the inner tip portions 33a and 33a.

In FIG. 2, the spacing W4 in the track-width direction between the inner tip portions 33a and 33a of the first electrode layers 33 and 33 is equal to the dimension W1 in the track-width direction of the first free magnetic layer 29.

In the magnetic sensing element shown in FIG. 2, both side regions 35s and 35s of a concave portion 35a of the second antiferromagnetic layer 35 are at a distance from the track-width region A. Both the side regions 35s and 35s of the second antiferromagnetic layer 35 are regions exhibiting an antiferromagnetic property, and therefore, exchange coupling magnetic fields are generated between both the side regions 35s and 35s and a second free magnetic layer 30. At this time, the magnetization of the second free magnetic layer 30 may also be pinned in regions nearer to the track-width region A than are the regions overlapping both the side regions 35s and 35s.

However, in the magnetic sensing element shown in FIG. 2, since spaces are provided between both the side regions 35s and 35s of the second antiferromagnetic layer 35 and the track-width region A, formation of a dead zone in the track-width region A of the free magnetic layer 31 can be suppressed, and therefore, the playback output can be improved.

Figure 3:
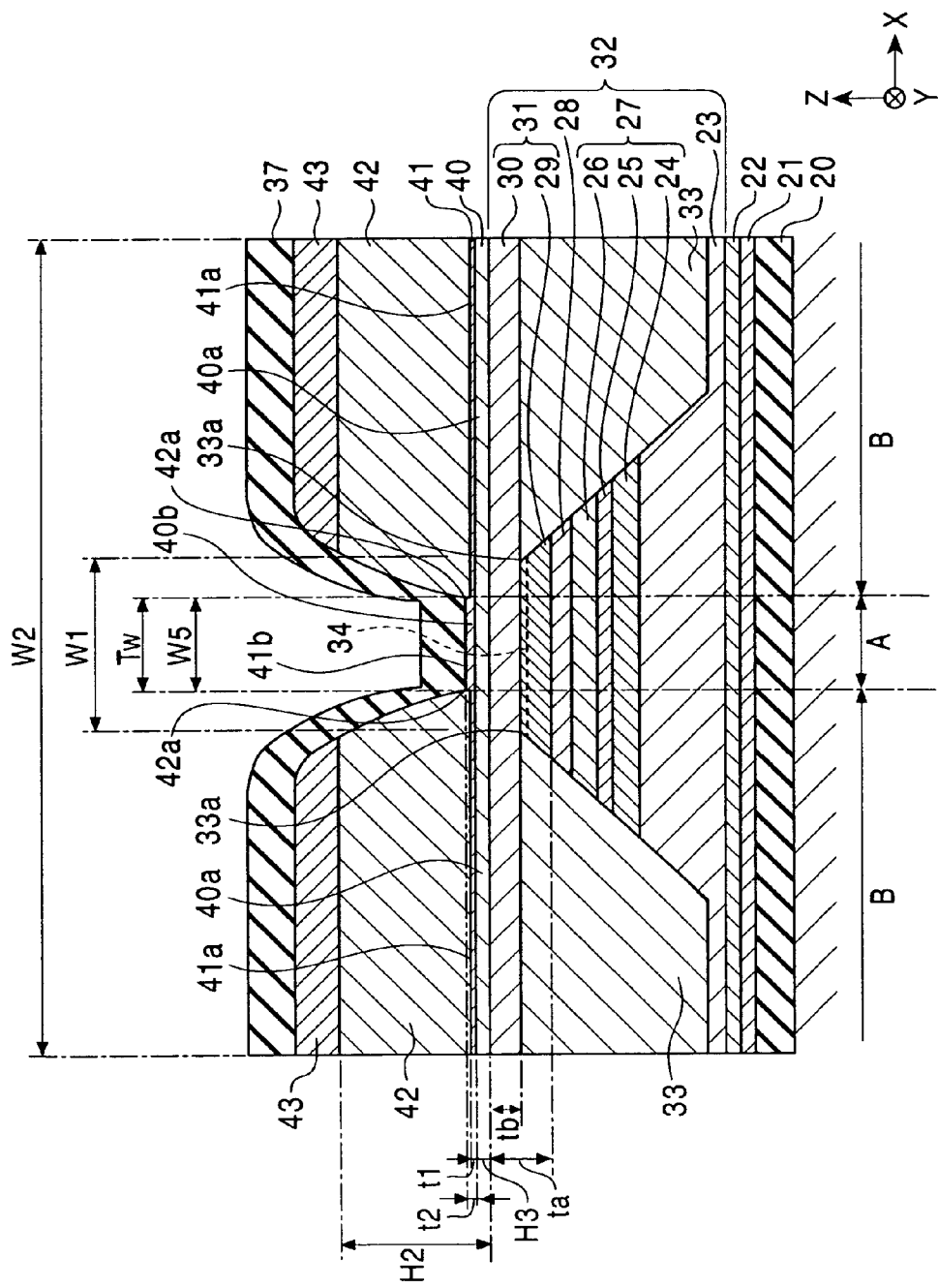
FIG. 3 is a partial sectional view of the structure of a magnetic sensing element according to a third embodiment of the present invention, viewed from the side of a surface facing a recording medium.

FIG. 3 is a partial sectional view of a magnetic sensing element according to a third embodiment of the present invention, viewed from the side of a surface facing a recording medium.

In a magnetic sensing element shown in FIG. 3, the shapes, the materials and the film thicknesses of gap layers 20 and 37, a substrate layer 21, a seed layer 22 and a multilayer film 32 composed of a first antiferromagnetic layer 23, a pinned magnetic layer 27, a non-magnetic material layer 28 and a free magnetic layer 31 are the same as those of the magnetic sensing element shown in FIG. 1.

The magnetic sensing element shown in FIG. 3 differs from the magnetic sensing element shown in FIG. 1 simply in the configuration of a second antiferromagnetic layer which supplies a vertical bias magnetic field to a free magnetic layer 31.

In the magnetic sensing element shown in FIG. 3, a pair of second antiferromagnetic layers 42 and 42 having a spacing in the track-width direction are provided on a second free magnetic layer 30 with a third antiferromagnetic layer 40 therebetween. The materials for the third antiferromagnetic layer 40 and the second antiferromagnetic layers 42 and 42 are the same as the material for the first antiferromagnetic layer 23.

The second electrode layers 43 and 43 are provided on the second antiferromagnetic layers 42 and 42. The second electrode layers 43 and 43 are for assisting the first electrode layers 33 and 33. Consequently, the second electrode layers 43 and 43 are not necessarily provided.

In the embodiment shown in FIG. 3, the third antiferromagnetic layer 40 is provided on the track-width region A of the free magnetic layer 31 as well. However, the second antiferromagnetic layers 42 and 42 are not provided on the track-width region A.

Preferably, the film thickness H3 of the third antiferromagnetic layer 40 is 5 angstroms or more, but 50 angstroms or less. More preferably, the film thickness is 10 angstroms or more, but 50 angstroms or less, and further preferably, is 30 angstroms or more, but 40 angstroms or less.

Furthermore, in the present embodiment, since a non-magnetic intermediate layer 41 having a function as a protective layer is laminated on the third antiferromagnetic layer 40, degradation of antiferromagnetic property of the third antiferromagnetic layer 40 can be reduced during the manufacturing process and after the manufacture. Consequently, in the present embodiment, the film thickness H3 of the third antiferromagnetic layer 40 is allowed to become 5 angstroms or more, but 50 angstroms or less, e.g. in the order of 10 angstroms.

The central portion 40b of the third antiferromagnetic layer 40 overlapping the track-width region A of the free magnetic layer 31 is unlikely to be transformed into an ordered state by even magnetic annealing when formed to have such a reduced film thickness. Consequently, no exchange coupling magnetic field is generated between the central portion 40b of the third antiferromagnetic layer 40 and the track-width region A of the free magnetic layer 31. Even when an exchange coupling magnetic field is generated, the value thereof is small.

The film thickness of the third antiferromagnetic layer 40 is specified to be 5 angstroms or more because when the third antiferromagnetic layer is too thin, exchange coupling magnetic fields generated between both side regions 40a and 40a of the central portion 40b of the third antiferromagnetic layer 40 and both the side regions B and B of the free magnetic layer 31 are weakened, and therefore, the magnetization of both the side regions B and B of the free magnetic layer 31 may not be properly pinned in the track-width direction.

As described above, antiferromagnetic interactions take place between both the side regions 40a and 40a of the third antiferromagnetic layer 40 and the second antiferromagnetic layers 42 and 42 provided thereon with the non-magnetic intermediate layer 41 therebetween, and thereby, both the side regions 40a and 40a of the third antiferromagnetic layer 40 and the second antiferromagnetic layers 42 and 42 perform a function as an integrated antiferromagnetic layer. However, since it is not physically perfect integration, when the film thickness of the third antiferromagnetic layer 40 is small, transformation of this third antiferromagnetic layer 40 into an ordered state is weak, and therefore, exchange coupling magnetic fields generated between both side regions 40a and 40a of the third antiferromagnetic layer 40 and both the side regions B and B of the free magnetic layer 31 are weakened. Consequently, the film thickness of the third antiferromagnetic layer 40 is specified to be 5 angstroms or more.

When the film thickness of the third antiferromagnetic layer 40 is specified to be 5 angstroms or more, but 50 angstroms or less, the shunt loss in the central portion 40b can be reduced, and therefore, the playback output can be increased.

Preferably, the total film thickness H2 of the film thickness of both the side regions 40a and 40a of the third antiferromagnetic layer 40 and the film thickness of the second antiferromagnetic layers 42 and 42 is 80 angstroms or more, but 300 angstroms or less. In this manner, both the side regions 40a and 40a of the third antiferromagnetic layer 40 appropriately have an antiferromagnetic property, both the side regions 40a and 40a of the third antiferromagnetic layer 40 are transformed into ordered states by magnetic annealing, exchange coupling magnetic fields are generated between both the side regions 40a and 40a of the third antiferromagnetic layer 40 and both side regions B and B of the free magnetic layer 31 (the second free magnetic layer 30), and therefore, the magnetization of both the side regions B and-B of the free magnetic layer 31 (the second free magnetic layer 30) can be pinned in the track-width direction.

A non-magnetic intermediate layer 41 will be described. The above-mentioned non-magnetic intermediate layer 41 has the function as a protective layer provided for preventing oxidation of the third antiferromagnetic layer 40 due to exposure to air, as is explained in the manufacturing method described below.

The central portion 41b of the non-magnetic intermediate layer 41 has a film thickness t1 which remains unchanged after film formation. On the other hand, both the side regions 41a and 41a of the non-magnetic intermediate layer 41 are cut by ion milling during the manufacturing process, and therefore, the film thicknesses t2 thereof are smaller than the film thickness of the central portion 41b of the non-magnetic intermediate layer 41.

The film thickness t1 of the central portion 41b of the non-magnetic intermediate layer 41 is 2 angstroms to 10 angstroms, and more preferably, is 2 angstroms to 5 angstroms.

Preferably, both the side regions 41a and 41a of the non-magnetic intermediate layer 41 interposed between the third antiferromagnetic layer 40 and the second antiferromagnetic layers 42 and 42 are formed to have a small film thickness t2 of 0.2 angstroms or more, but 3 angstroms or less. More preferably, the film thicknesses of both the side regions 41a and 41a of the non-magnetic intermediate layer 41 are 0.2 angstroms or more, but 1.0 angstrom or less.

An average film thickness can be measured by, for example, fluorescent X-ray analysis or EDX analysis of a cross section with a transmission electron microscope.

The average film thickness of the non-magnetic intermediate layer 41 sometimes becomes less than 1 angstrom. It is known that 1 angstrom corresponds to a dimension smaller than the diameter of one atom, and therefore, no uniform thin film having a film thickness of less than 1 angstrom exists. However, in a thin film in which elements are unevenly or sparsely present, there are regions including elements and regions including no element. As a result, when the average film thickness of the non-magnetic intermediate layer 41 is defined as described above, the average film thickness of the non-magnetic intermediate layer 41 sometimes becomes less than 1 angstrom.

When the non-magnetic intermediate layer 41 is formed to have a small film thickness to the extent as described above, antiferromagnetic interactions take place between the third antiferromagnetic layer 40 and the second antiferromagnetic layers 42 and 42 through the non-magnetic intermediate layer 41, and thereby, the third antiferromagnetic layer 40 and the second antiferromagnetic layers 42 and 42 are likely to perform a function as an integrated antiferromagnetic layer.

Consequently, the embodiment shown in FIG. 3 has a configuration similar to the form in which an antiferromagnetic layer having a large film thickness, having an antiferromagnetic property, is provided on both the side regions B and B of the free magnetic layer 31 (the second free magnetic layer 30), and the magnetization of both the side regions B and B of the free magnetic layer 31 is appropriately pinned in the track-width direction (the X direction shown in the drawing) by exchange coupling magnetic fields generated between both the side regions 40a and 40a of the third antiferromagnetic layer 40 and the free magnetic layer 31.

The non-magnetic intermediate layer 41 is formed from Cr or at least one noble metal selected from the group consisting of Ru, Re, Pd, Os, Ir, Pt, Au and Rh.

These materials are unlikely to oxidize due to exposure to air compared with a Ta film conventionally used as an oxidation-protective film.

When the element constituting the non-magnetic intermediate layer 41 is composed of at least one noble metal selected from the group consisting of Ru, Re, Pd, Os, Ir, Pt, Au and Rh, even if these noble metal elements diffuse into the third antiferromagnetic layer 40 or the second antiferromagnetic layers 42 and 42, the antiferromagnetic property of the third antiferromagnetic layer 40 or the second antiferromagnetic layers 42 and 42 is not degraded.

When the non-magnetic intermediate layer 41 is formed from Cr, the exchange coupling magnetic field (Hex) generated between the third antiferromagnetic layer 40 and the free magnetic layer 31 becomes large compared with that in the case where the non-magnetic intermediate layer 41 is formed from an element other than Cr, for example, from at least one element selected from the group consisting of Ru, Re, Pd, Os, Ir, Pt, Au and Rh.

The reason for this is believed that when the non-magnetic intermediate layer 41 made of Cr is present on the third antiferromagnetic layer 40, the third antiferromagnetic layer 40 is nearly completely transformed into an ordered state in the vicinity of the interface between the third antiferromagnetic layer 40 and the free magnetic layer 31, and as a result, an exchange coupling magnetic field generated at the above-mentioned interface becomes large.

The elements constituting the non-magnetic intermediate layer 41 diffuse into the third antiferromagnetic layer 40 and the second antiferromagnetic layers 42 and 42. The diffusion of the elements constituting the non-magnetic intermediate layer 41 can be measured with, e.g. an SIMS analyzer. For example, when the third antiferromagnetic layer 40 is formed from a PtMn alloy, and the non-magnetic intermediate layer 41 is formed from Cr in the film formation stage, a diffusion layer of a Cr—Pt—Mn alloy is formed in the diffusion region by magnetic anneal or the like.

The present invention also includes a magnetic sensing element in which the central portion 41b of the non-magnetic intermediate layer 41 is simply present and both the side regions 41a and 41a having interfaces are not present. The elements constituting the non-magnetic intermediate layer 41 diffuse into the third antiferromagnetic layer 40 and the second antiferromagnetic layers 42 and 42 of such a magnetic sensing element as well.

Preferably, both the side regions 41a and 41a of the non-magnetic intermediate layer 41 is left while having an average film thickness of 0.2 angstroms or more. In this manner, the third antiferromagnetic layer 40 is not damaged by ion milling, and a problem of degradation of magnetic characteristics of the third antiferromagnetic layer 40 does not occur.

Since low-energy ion milling can be used, both the side regions 41a and 41a of the non-magnetic intermediate layer 41 can be left while having a very small film thickness of 3 angstroms or less, as shown in FIG. 3. The non-magnetic intermediate layer 41 is originally formed to have a small film thickness of 2 angstroms to 10 angstroms, preferably, 2 angstroms to 5 angstroms, in the film formation stage. Consequently, adjustment of the film thickness of the non-magnetic intermediate layer 41 can be sufficiently performed even by low-energy ion milling. The milling rate is low because of low energy compared with the milling rate in the case of high energy. Therefore, control is relatively easy, and the milling can be stopped midway through cutting of the non-magnetic intermediate layer 41.

The low-energy ion milling is defined as ion milling using an ion beam with a beam voltage (acceleration voltage) of less than 100 V. For example, a beam voltage of 100 V to 500 V is used. In the present embodiment, an argon (Ar) ion beam with a low beam voltage of 200 V is used.

The magnetic sensing element of the present embodiment also has a structure in which the second free magnetic layer 30 is laminated on the first free magnetic layer 29. Consequently, successive film formation of the second free magnetic layer 30 and the third antiferromagnetic layer 40 can be performed, and it becomes easy to generate an exchange coupling magnetic field required for sufficiently reducing side leading.

In the present embodiment as well, the film thicknesses tb of both the side regions B and B of the free magnetic layer 31 overlapping the second antiferromagnetic layers 42 and 42 can be made smaller than the film thickness ta of the track-width region A of the free magnetic layer 31, so that exchange coupling magnetic fields generated between the second antiferromagnetic layers 42 and 42 and both the side regions B and B of the free magnetic layer 31 can be increased, and therefore, side leading can be reduced.

Static magnetic fields generated from both the side regions B and B of the free magnetic layer 31 can be reduced by reducing the film thicknesses tb of both the side regions B and B.

Furthermore, the magnetic flux density in the track-width region A of the free magnetic layer 31 resulting from the static magnetic fields generated from both the side regions B and B of the free magnetic layer 31 can be reduced, a dead zone which occurs in the track-width region A of the free magnetic layer 31 can be reduced, and therefore, the magnetic field detection sensitivity is improved. Here, a dead zone in the free magnetic layer 31 refers to a region in which magnetization is unlikely to fluctuate even when an external magnetic field is applied.

Preferably, the dimension W1 in the track-width direction of the first free magnetic layer 29 is 0.18 $\mu$m or less in the present embodiment as well. More preferably, the dimension W1 in the track-width direction of the first free magnetic layer 29 is 0.15 $\mu$m or less.

The first free magnetic layer 29 and the second free magnetic layer 30 may be provided as an integrated ferromagnetic layer. A non-magnetic intermediate layer 34 indicated by a dotted line may be provided between the first free magnetic layer 29 and the second free magnetic layer 30.

In the magnetic sensing element shown in FIG. 3, the spacing W5 in the track-width direction between the second antiferromagnetic layers 42 and 42 is smaller than or equal to the dimension W1 in the track-width direction of the first free magnetic layer 29.

In this configuration, the second antiferromagnetic layers 42 and 42 can be overlapped with both the side regions B and B of the track-width region A of the first free magnetic layer 29 as well, and therefore, the magnetic sensing element becomes suitable for reducing side leading.

In the magnetic sensing element shown in FIG. 3, the track-width region A is a region sandwiched by a pair of the second antiferromagnetic layers 42 and 42. Consequently, the optical track-width dimension Tw becomes equal to the spacing W5 in the track-width direction between the inner end edges 42a and 42a of the second antiferromagnetic layers 42 and 42.

Therefore, the dimension W1 in the track-width direction of the first free magnetic layer 29 is larger than the optical track-width dimension Tw.

Figure 4:
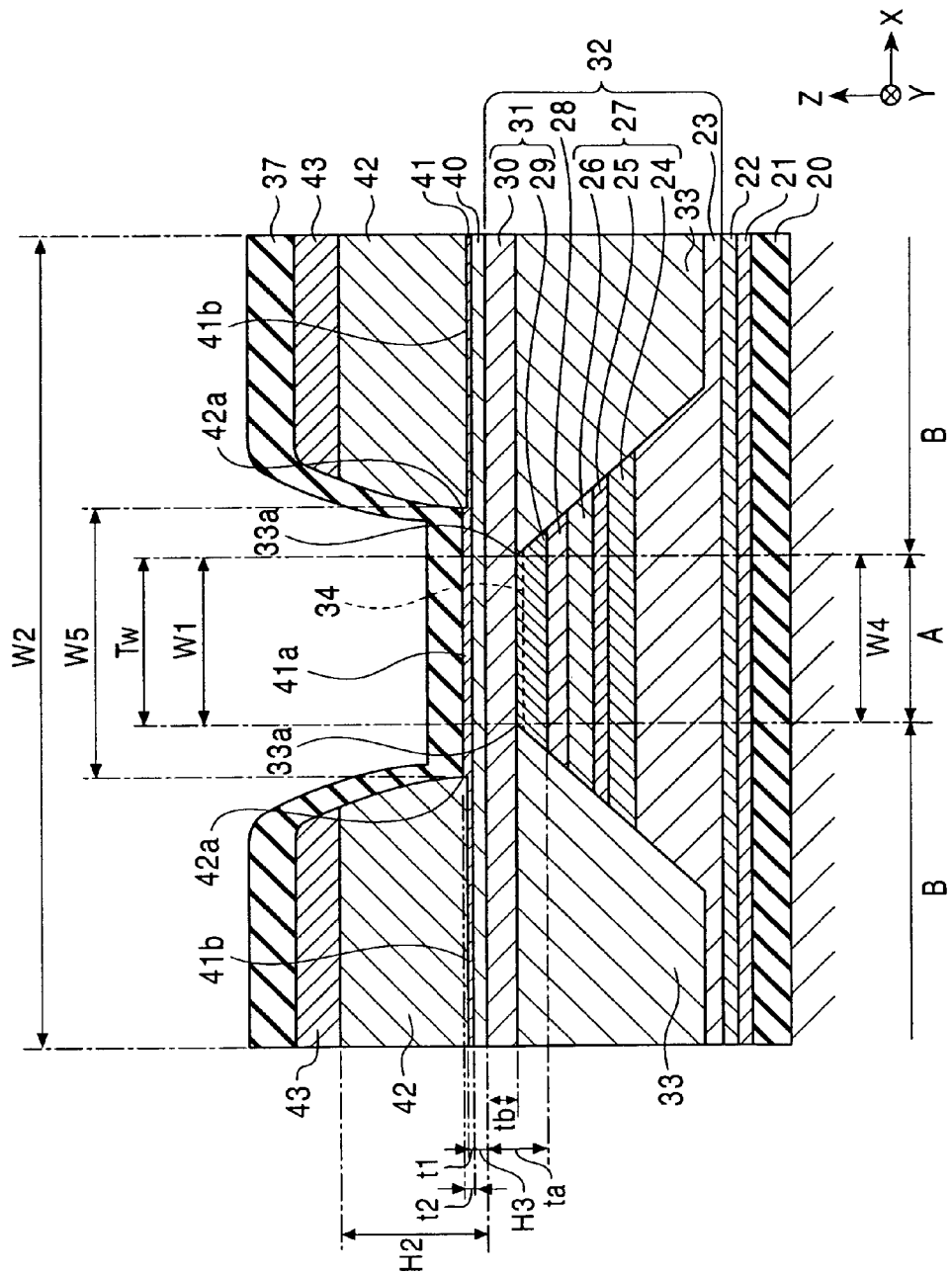
FIG. 4 is a partial sectional view of the structure of a magnetic sensing element according to a fourth embodiment of the present invention, viewed from the side of a surface facing a recording medium.

A magnetic sensing element shown in FIG. 4 differs from the magnetic sensing element shown in FIG. 3 simply in that the spacing W5 in the track-width direction between the second antiferromagnetic layers 42 and 42 is larger than the dimension W1 in the track-width direction of the first free magnetic layer 29.

Since the material, the shape and the film thickness of each layer, except for the second antiferromagnetic layers 42 and 42, of the magnetic sensing element shown in FIG. 4 are the same as those of each layer indicated by the same reference numeral shown in FIG. 3, further explanations thereof will not be provided.

In the magnetic sensing element shown in FIG. 4, the track-width region A is a region sandwiched by inner tip portions 33a and 33a of first electrode layers 33 and 33. Consequently, the optical track-width dimension Tw becomes equal to the spacing W4 in the track-width direction between the inner tip portions 33a and 33a.

In FIG. 4, the spacing W4 in the track-width direction between the inner tip portions 33a and 33a of the first electrode layers 33 and 33 is equal to the dimension W1 in the track-width direction of the first free magnetic layer 29.

In the magnetic sensing element shown in FIG. 4, the inner end edges 42a and 42a of the second antiferromagnetic layers 42 and 42 are at a distance from the track-width region A. When exchange coupling magnetic fields are generated between the second antiferromagnetic layers 42 and 42 and a second free magnetic layer 30, the magnetization of the second free magnetic layer 30 may also be pinned in regions nearer to the track-width region A than are the regions overlapping the second antiferromagnetic layers 42 and 42.

However, in the magnetic sensing element shown in FIG. 4, since spaces are provided between the inner end edges 42a and 42a of the second antiferromagnetic layers 42 and 42 and the track-width region A, formation of a dead zone in the track-width region A of the free magnetic layer 31 can be suppressed.

Figure 5:
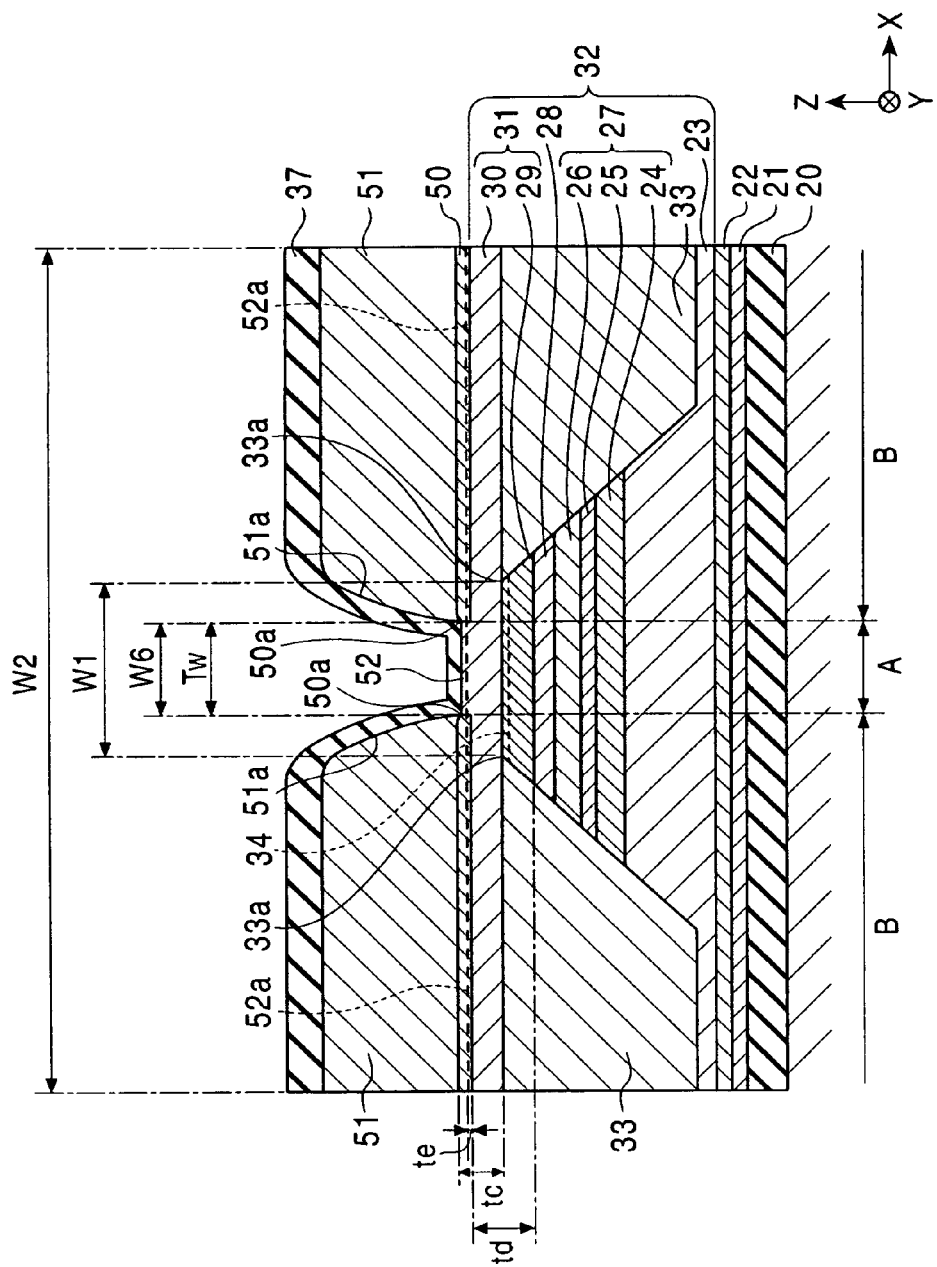
FIG. 5 is a partial sectional view of the structure of a magnetic sensing element according to a fifth embodiment of the present invention, viewed from the side of a surface facing a recording medium.

FIG. 5 is a partial sectional view of a magnetic sensing element according to a fifth embodiment of the present invention, viewed from the side of a surface facing a recording medium.

In a magnetic sensing element shown in FIG. 5, the materials and the film thicknesses of gap layers 20 and 37, a substrate layer 21, a seed layer 22 and a multilayer film 32 composed of a first antiferromagnetic layer 23, a pinned magnetic layer 27, a non-magnetic material layer 28 and a free magnetic layer 31 are the same as those of the magnetic sensing element shown in FIG. 1.

The magnetic sensing element shown in FIG. 5 differs from the magnetic sensing element shown in FIG. 1 simply in the configuration of second antiferromagnetic layers 51 and 51 which supply a vertical bias magnetic field to a free magnetic layer 31, and a pair of the second antiferromagnetic layers 51 and 51 are provided on a second free magnetic layer 30 through a pair of antiferromagnetic layers 50 having a spacing in the track-width direction.

In the present embodiment, the total film thickness tc of the film thickness of the ferromagnetic layer 50 and the film thickness of the second free magnetic layer 30 is smaller than the total film thickness td of the film thickness of the first free magnetic layer 29 and the film thickness of the second free magnetic layer 30.

In the present embodiment, static magnetic fields generated from inner end surfaces 50a and 50a of the ferromagnetic layers 50 and 50 may enter into the track-width region A of the free magnetic layer 31.

However, the total film thickness tc of the film thickness of the ferromagnetic layers 50 and 50 overlapping the second antiferromagnetic layers 51 and 51 and the second free magnetic layer 30 can be made smaller than the film thickness td of the track-width region A of the free magnetic layer 31, static magnetic fields which enter into the track-width region A of the free magnetic layer 31 from both the side regions can be reduced, and an exchange coupling magnetic field generated between the second antiferromagnetic layers 51 and 51 and the ferromagnetic layer 50 can be increased.

Furthermore, the magnetic flux density in the track-width region A of the free magnetic layer 31 resulting from the static magnetic fields generated from both the side regions B and B of the free magnetic layer 31 can be reduced, a dead zone which occurs in the track-width region A of the free magnetic layer 31 can be reduced, and therefore, the magnetic field detection sensitivity is improved. Here, a dead zone in the free magnetic layer 31 refers to a region in which magnetization is unlikely to fluctuate even when an external magnetic field is applied.

A non-magnetic intermediate layer 52 is present in a region sandwiched between the second antiferromagnetic layers 51 and 51 on the second free magnetic layer 30.

The non-magnetic intermediate layer 52 may also be formed between the second free magnetic layer 30 and the ferromagnetic layer 50 to have a film thickness te within the range of 2 angstroms to 5 angstroms.

The non-magnetic intermediate layer 52 has the function as a protective layer provided for preventing oxidation of the second free magnetic layer 30 due to exposure to air, as is explained in the manufacturing method described below.

The non-magnetic intermediate layer 52 is formed from Cr or at least one noble metal selected from the group consisting of Ru, Re, Pd, Os, Ir, Pt, Au, Rh and Cu.

These materials are unlikely to oxidize due to exposure to air compared with a Ta film conventionally used as an oxidation-protective film, or are materials in which oxidization is unlikely to proceed in the film thickness direction even when oxidized.

When the film thicknesses of both the side regions 52a and 52a of the non-magnetic intermediate layer 52 provided between the second free magnetic layer 30 and the ferromagnetic layer 50 are within the range of 0.2 angstroms to 5 angstroms, the second free magnetic layer 30 and the ferromagnetic layer 50 can be made to perform a function as integrated ferromagnetism.

Alternatively, when the film thicknesses of both the side regions 52a and 52a of the non-magnetic intermediate layer 52 are within the range of 5 angstroms to 11 angstroms, the second free magnetic layer 30 and the ferromagnetic layer 50 construct a synthetic, ferrimagnetic structure, and therefore, the magnetization of both the side regions B and B of the second free magnetic layer 30 can be strongly pinned.

Since low-energy ion milling can be used, both the side regions 52a and 52a of the non-magnetic intermediate layer 52 can be left while having a very small film thickness of 3 angstroms or less.

The above-mentioned materials for the non-magnetic intermediate layer 52 are unlikely to oxidize, or are materials in which oxidization is unlikely to proceed in the film thickness direction. Consequently, a sufficient effect of preventing oxidation is exerted even when the film thickness of the non-magnetic intermediate layer 52 is small. Therefore, even when an oxide layer is formed on the surface of the non-magnetic intermediate layer 52 during the manufacturing process of the magnetic sensing element, the oxide layer can be removed by low-energy ion milling, and thereby, degradation of the ferromagnetic property of the second free magnetic layer 30 provided as a layer under the non-magnetic intermediate layer 52 can be prevented.

In the magnetic sensing element of the present embodiment, successive film formation of the ferromagnetic layer 50 and the second antiferromagnetic layer 51 can be performed, and it becomes easy to generate an exchange coupling magnetic field required for sufficiently reducing side leading.

Preferably, the dimension W1 in the track-width direction of the first free magnetic layer 29 is 0.18 μm or less in the present embodiment as well. More preferably, the dimension W1 in the track-width direction of the first free magnetic layer 29 is 0.15 μm or less.

The first free magnetic layer 29 and the second free magnetic layer 30 may be provided as an integrated ferromagnetic layer. A non-magnetic intermediate layer 34 indicated by a dotted line may be provided between the first free magnetic layer 29 and the second free magnetic layer 30.

In the magnetic sensing element shown in FIG. 5, the spacing W6 in the track-width direction between the second antiferromagnetic layers 51 and 51 is smaller than or equal to the dimension W1 in the track-width direction of the first free magnetic layer 29.

In this configuration, the second antiferromagnetic layers 51 and 51 can be overlapped with both the side regions B and B of the track-width region A of the first free magnetic layer 29 as well, and therefore, the magnetic sensing element becomes suitable for reducing side leading.

In the magnetic sensing element shown in FIG. 5, the track-width region A is a region sandwiched by a pair of the second antiferromagnetic layers 51 and 51. Consequently, the optical track-width dimension Tw becomes equal to the spacing W6 in the track-width direction between the inner end edges 51*a* and 51*a* of the second antiferromagnetic layers 51 and 51.

Therefore, the dimension W1 in the track-width direction of the first free magnetic layer 29 is larger than the optical track-width dimension Tw.

In the magnetic sensing element, the inner end edges 51*a* and 51*a* of the second antiferromagnetic layers 51 and 51 may be at a distance from the track-width region A. According to this configuration, formation of a dead zone in the track-width region A of the free magnetic layer 31 can be suppressed.

At this time, the optical track-width dimension Tw is defined by the spacing in the track-width direction between a pair of first electrode layers 33 and 33 provided on both sides of the multilayer film 32.

A method for manufacturing the magnetic sensing element shown in FIG. 1 will be described.

Figure 6:
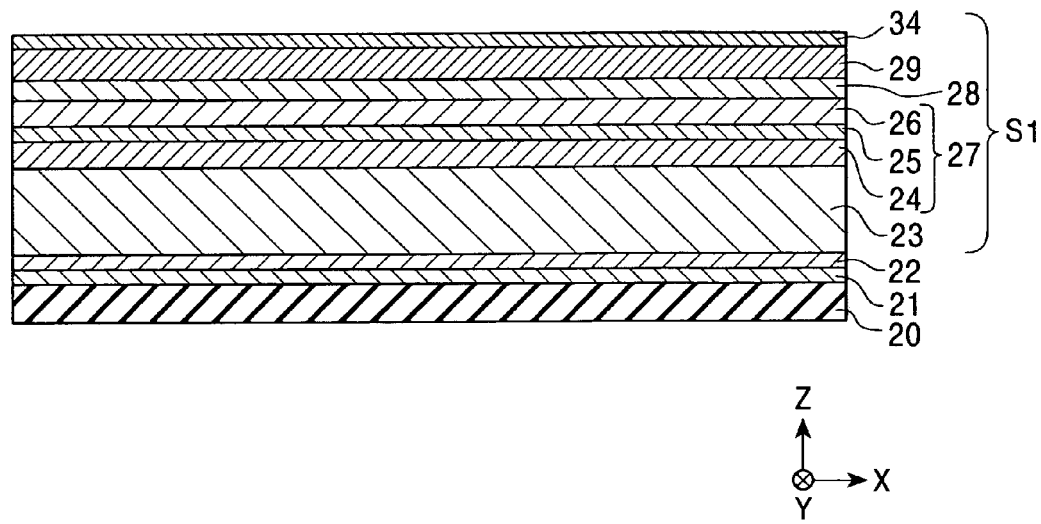
FIG. 6 is a diagram showing a step in the manufacturing process of a magnetic sensing element of the present invention.

In the step shown in FIG. 6, successive film formation of a gap layer 20, a substrate layer 21, a seed layer 22, a first antiferromagnetic layer 23, a pinned magnetic layer 27, a non-magnetic material layer 28, a first free magnetic layer 29 and a non-magnetic intermediate layer 34 is performed on a substrate or on a lower shield layer made of a magnetic material, not shown in the drawing, in that order from the bottom. Sputtering or evaporation is used for the film formation step.

Since the materials and the film thicknesses of the gap layer 20, the substrate layer 21, the seed layer 22, the first antiferromagnetic layer 23, the pinned magnetic layer 27, the non-magnetic material layer 28 and the first free magnetic layer 29 are the same as the materials and the film thicknesses of the layers indicated by the same reference numerals of the magnetic sensing element shown in FIG. 1, further explanations thereof will not be provided.

The non-magnetic intermediate layer 34 has the function as a protective layer provided for preventing oxidation of the first antiferromagnetic layer 29 due to exposure to air.

The non-magnetic intermediate layer 34 is formed from Cr or at least one noble metal selected from the group consisting of Ru, Re, Pd, Os, Ir, Pt, Au, Rh and Cu to have a very small film thickness of 2 angstroms to 10 angstroms, more preferably, 2 angstroms to 5 angstroms.

These materials are unlikely to oxidize due to exposure to air compared with a Ta film conventionally used as an oxidation-protective film, or are materials in which oxidization is unlikely to proceed in the film thickness direction even when oxidized.

The first magnetic annealing is performed. A heat treatment is performed at the first heat treatment temperature while the first magnetic field in the direction (the Y direction shown in the drawing) perpendicular to the track-width direction (the X direction shown in the drawing) is applied, an exchange coupling magnetic field is generated between the first antiferromagnetic layer 23 and the magnetic layer 24 constituting the pinned magnetic layer 27, and therefore, the magnetization of the magnetic layer 24 is pinned in the Y direction shown in the drawing. The magnetization of another magnetic layer 26 is pinned in the direction opposite to the Y direction shown in the drawing by an exchange coupling due to an RKKY interaction taking place between the magnetic layer 24 and the magnetic layer 26. For example, the first heat treatment temperature is specified to be 270° C., and the magnitude of the magnetic field is specified to be 800 kA/m.

The elements constituting the non-magnetic intermediate layer 34 diffuse into the first free magnetic layer by the above-mentioned annealing. The diffusion of the elements constituting the non-magnetic intermediate layer 34 can be measured by, e.g. EDX analysis with an SIMS analyzer or a transmission electron microscope.

Figure 7:
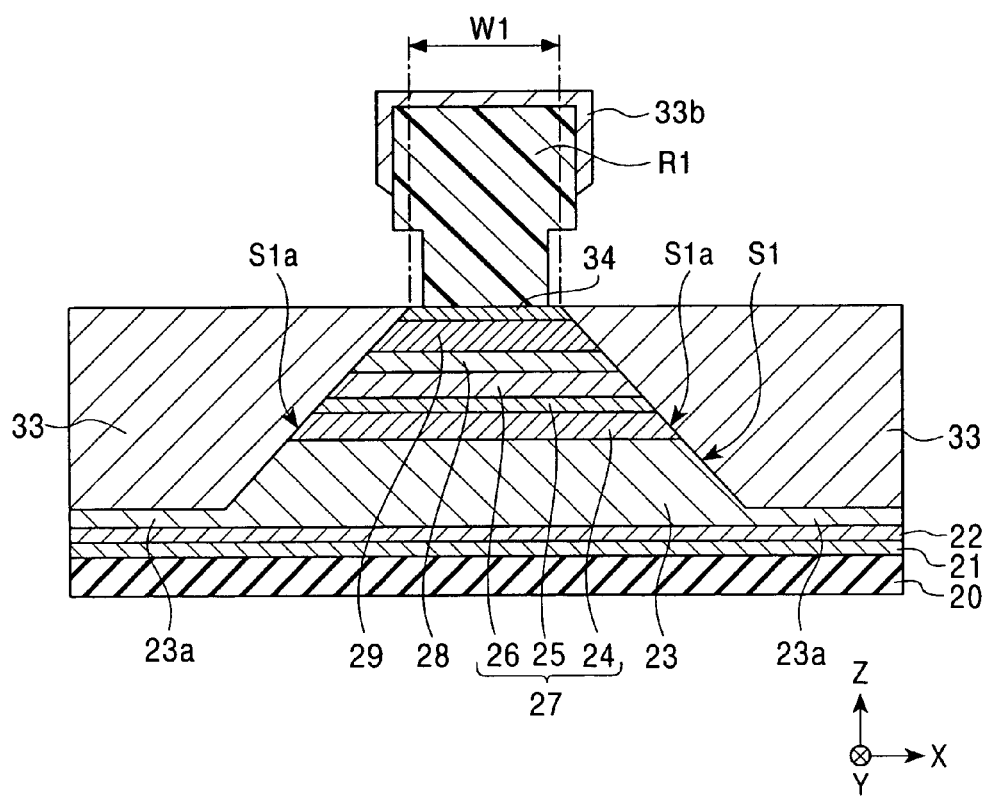
FIG. 7 is a diagram showing a step in the manufacturing process of a magnetic sensing element of the present invention.

In the step shown in FIG. 7, a resist layer R1 for lift-off is formed on the non-magnetic intermediate layer 34 shown in FIG. 6.

Both side regions, which are not covered with the resist layer R1, in the track-width direction (the X direction shown in the drawing) of a multilayer film S1 composed of from the non-magnetic intermediate layer 34 to the first antiferromagnetic layer 23 are removed by ion milling or the like.

In the step shown in FIG. 7, both side end surfaces S1*a* and S1*a* in the track-width direction (the X direction shown in the drawing) of the multilayer film S1 left under the resist layer R1 become inclined surfaces or curved surfaces having the width dimension in the track-width direction gradually decreasing from below upward (from the first antiferromagnetic layer 23 side to the non-magnetic intermediate layer 34 side).

The size of the resist layer R1 is adjusted in order that the dimension W1 in the track-width direction of the first free magnetic layer 29 in the multilayer film S1 left under the resist layer R1 becomes a predetermined dimension.

In FIG. 7, lower side regions 23*a* and 23*a* of the first antiferromagnetic layer 23 of the multilayer film S1 are formed extending beyond both the side end surfaces S1*a* and S1*a* in the X direction shown in the drawing. However, all of these extended lower side regions 23*a* may be removed, and the first antiferromagnetic layer 23 may be formed nearly in the shape of a trapezoid. In such a case, the layer surface of any one of the seed layer 22, the substrate layer 21 and the gap layer is exposed at resulting both sides in the track-width direction of the multilayer film S1.

First electrode layers 33 and 33 are formed on both the side regions in the track-width direction of the multilayer film S1. A sputtering method or an evaporation method is used for the above-mentioned film formation. The first electrode layers 33 and 33 are formed from, e.g. α—Ta, Au, Cr, Cu (copper), Rh, Ir, Ru or W (tungsten).

Film formation of the first electrode layers 33 and 33 is performed in order that the top surfaces of the first electrode layers 33 and 33 are located at nearly the same level as the top surface of the multilayer film S1.

A conductive material 33b for constituting the first electrode layers 33 and 33 also adheres to the periphery of the resist layer R1 during the film formation of the first electrode layers 33 and 33. Subsequently, the resist layer R1 for lift-off is removed.

Figure 8:
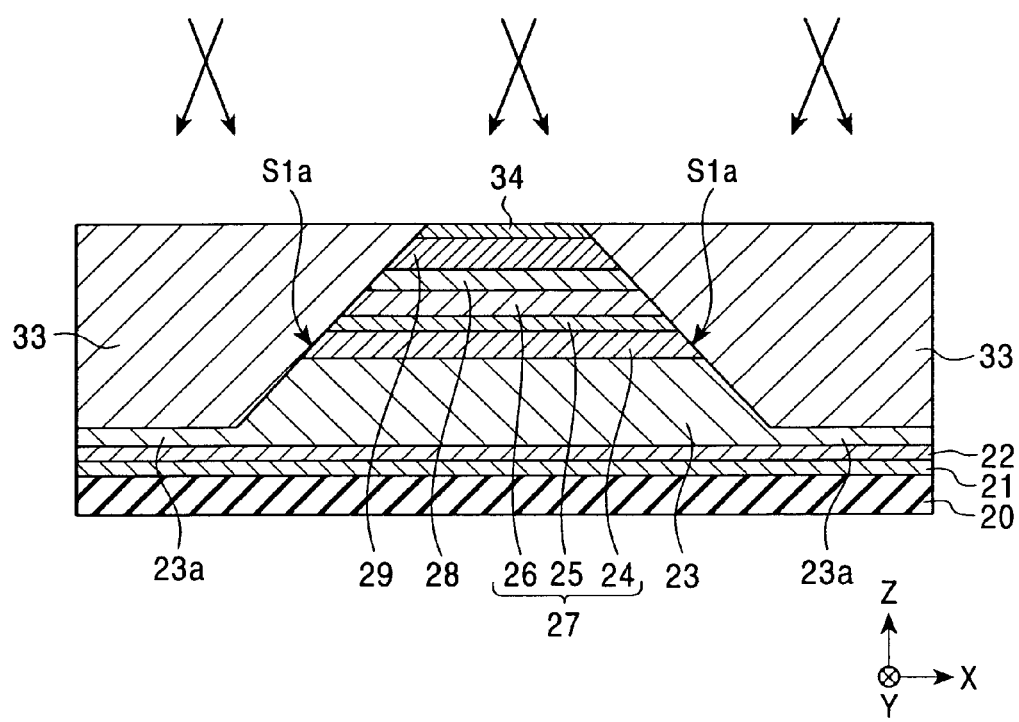
FIG. 8 is a diagram showing a step in the manufacturing process of a magnetic sensing element of the present invention.

In the step shown in FIG. 8, the non-magnetic intermediate layer 34 and the first electrode layers 33 and 33 are cut from the surfaces by ion milling, and therefore, oxide layers formed on the surfaces of the non-magnetic intermediate layer 34 and the first electrode layers 33 and 33 are removed. At this time, the non-magnetic intermediate layer 34 may be completely removed, or be left to have a film thickness of 0.2 angstroms to 5 angstroms. When a part of the non-magnetic intermediate layer 34 is left, it is preferable that the non-magnetic intermediate layer 34 is formed from Cu because degradation of the rate of change of resistivity of the magnetic sensing element can be prevented.

In the ion milling step shown in FIG. 8, low-energy ion milling can be used. The reason for this is that the non-magnetic intermediate layer 34 is formed to have a very small film thickness in the order of 2 angstroms to 10 angstroms, more preferably, in the order of 2 angstroms to 5 angstroms, and furthermore, the film thickness of the oxide layer formed on the surface of the non-magnetic intermediate layer 34 becomes a very small film thickness in the order of 3 angstroms to 6 angstroms.

Even when the non-magnetic intermediate layer 34 has a small film thickness as described above, oxidation of the first free magnetic layer 29 can be sufficiently prevented, and it is easy to control the milling because of low-energy ion milling, so that the milling can be stopped at a midway through the non-magnetic intermediate layer 34 or at the top surface of the first free magnetic layer 29.

Consequently, degradation of the ferromagnetic characteristics of the first free magnetic layer 29 due to cutting away of the surface of the first free magnetic layer 29 during the ion milling step can be prevented.

The low-energy ion milling is defined as ion milling using an ion beam with a beam voltage (acceleration voltage) of less than 100 V. For example, a beam voltage of 100 V to 500 V is used. In the present embodiment, an argon (Ar) ion beam with a low beam voltage of 200 V is used. In this manner, the low-energy ion milling can be used in the present invention, and therefore, the milling control can be improved compared with that heretofore attained.

Preferably, the milling is performed for a milling time in the order of 20 seconds to 40 seconds at a milling angle of 30° to 70°, and more preferably, 40° to 60°, which is the inclination with respect to the direction perpendicular to the surface of the non-magnetic intermediate layer 34.

On the other hand, when conventionally, commonly used Ta, for example, is used as the non-magnetic intermediate layer 34, since Ta is likely to oxidize due to exposure to air, oxidation of a layer provided thereunder cannot be sufficiently prevented unless the non-magnetic intermediate layer 34 is formed to have a large film thickness in the order of 30 angstroms to 50 angstroms, and in addition, the volume of Ta is increased due to oxidation, so that the film thickness of the non-magnetic intermediate layer 34 swells to about 50 angstroms or more.

Since high-energy ion milling is required to remove the non-magnetic intermediate layer 34 having such a large film thickness by ion milling, it becomes very difficult to control the milling in order that the non-magnetic intermediate layer 34 is simply removed. As a result, a part of the surface of the first free magnetic layer 29 provided thereunder is also cut away, and therefore, the ferromagnetic characteristics of the first free magnetic layer 29 are degraded.

Figure 9:
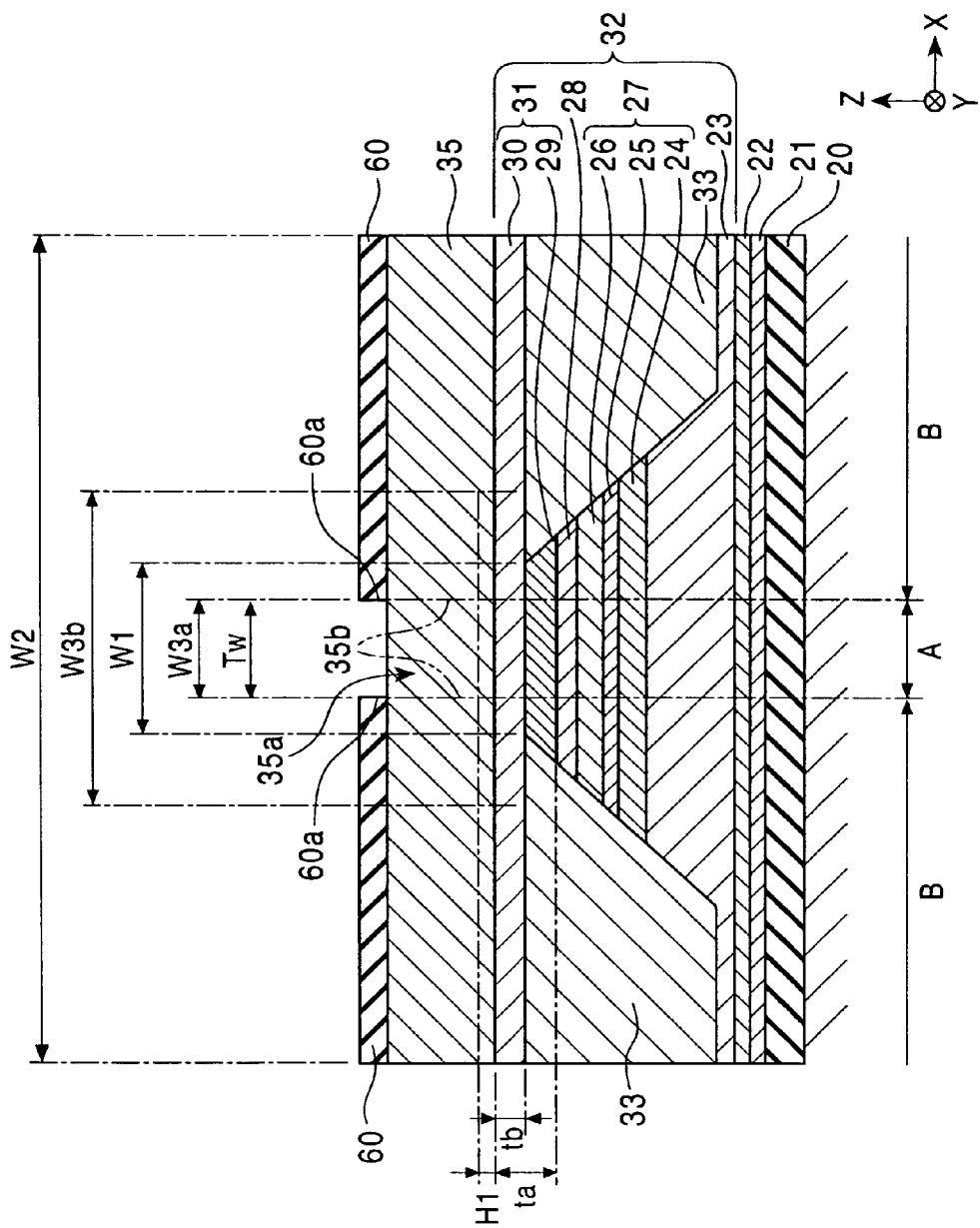
FIG. 9 is a diagram showing a step in the manufacturing process of a magnetic sensing element of the present invention.

After the oxide layers formed on the surfaces of the non-magnetic intermediate layer 34 and the first electrode layers 33 and 33 are removed, in the step shown in FIG. 9, the second free magnetic layer 30 having a dimension W2 in the track-width direction larger than a dimension W1 in the track-width direction of the first free magnetic layer 29 is laminated on the first free magnetic layer 29, and furthermore, successive film formation of the second antiferromagnetic layer 35 is performed on the second free magnetic layer 30. The second antiferromagnetic layer 35 is formed to have a film thickness of 80 angstroms or more, but 300 angstroms or less. The materials for the second free magnetic layer 30 and the second antiferromagnetic layer 35 are the same as the materials for the second free magnetic layer 30 and the second antiferromagnetic layer 35 of the magnetic sensing element shown in FIG. 1.

Mask layers 60 made of, e.g. an inorganic material are formed, while having a predetermined spacing W3a in the track-width direction (the X direction shown in the drawing), on the second antiferromagnetic layer 35. Examples of the above-mentioned inorganic materials include, for example, Cr, Ta, Ti, Si, Zr, Nb, Mo, Hf, W, Al—O, Al—Si—O and Si—O. When the mask layer 60 is formed from a metallic material among them, the mask layer 60 can be left unchanged after the manufacturing process so as to perform the function as the second electrode layers 36 and 36.

Regarding the formation of the mask layer 60, for example, a resist layer (not shown in the drawing) is stood on the central portion of the second antiferromagnetic layer 35, both sides thereof are filled in with the mask layer 60, and subsequently, the above-mentioned resist layer is removed, so that a spacing W3a having a predetermined width is formed in the mask layer 60. Alternatively, the mask layer 60 is formed all over the second antiferromagnetic layer 35, a resist layer (not shown in the drawing) is formed overlapping the mask layer 60, a hole is formed in the central portion of the above-mentioned resist layer by exposure phenomenon, and subsequently, the mask layer 60 exposed at the hole is cut by RIE or the like, so that the spacing W3a having a predetermined width is formed in the mask layer 60.

Alternatively, the mask layer 60 may be formed from a resist.

The second antiferromagnetic layer 35 exposed at the spacing W3a of the mask layer 60 is cut by RIE or ion milling, and therefore, a concave portion 35a (refer to FIG. 1) is formed. At this time, preferably, the second antiferromagnetic layer 35 under the bottom of the concave portion 35a is cut away until the film thickness reaches 5 angstroms to 50 angstroms, and more preferably, 10 angstroms to 50 angstroms. The central portion 35c (refer to FIG. 1) of the second antiferromagnetic layer 35 otherwise keeps on having an antiferromagnetic property, an exchange coupling magnetic field is generated between the central portion 35c of the second antiferromagnetic layer 35 and the track-width region A of the free magnetic layer 31 during the second magnetic annealing in the following step, so that the magnetization of the track-width region A of the free magnetic layer 31 is strongly pinned.

Since the second antiferromagnetic layer 35 is cut away in the direction perpendicular to the surface thereof, the inner end surfaces 35b and 35b of the second antiferromagnetic layer 35 are formed in the direction (the Z direction shown in the drawing) perpendicular to the surface of the second antiferromagnetic layer 35.

When the inner end surfaces 60a and 60a of the mask layer 60 are formed into inclined surfaces or curved surfaces, or when the incident angle of the milling is specified to be in a slanting direction with respect to the surface of the second antiferromagnetic layer 35, the inner end surfaces 35b and 35b of the second antiferromagnetic layer 35 are also formed as inclined surfaces or curved surfaces.

The degree of the cutting away is arbitrarily determined. However, it is important that no antiferromagnetic layer having a large film thickness to the extent of taking on antiferromagnetism is left on at least the central portion 35c overlapping the track-width region A of the free magnetic layer 31 (the second free magnetic layer 30), and the free magnetic layer 31 (the second free magnetic layer 30) is not cut away during the above-mentioned RIE or ion milling step. When the free magnetic layer 31 is cut away by the ion milling or the like, undesirably, the free magnetic layer 31 (the second free magnetic layer 30) is damaged by the ion milling, and thereby, the magnetic characteristics become likely to degrade.

After the above-mentioned RIE or ion milling step is completed, the second magnetic annealing is performed. At this time, the direction of the magnetic field is the track-width direction (the X direction shown in the drawing). In this second magnetic annealing, the second-applied magnetic field is specified to be smaller than the exchange-anisotropic magnetic field of the first antiferromagnetic layer 23, and in addition, the heat treatment temperature is specified to be lower than the blocking temperature of the first antiferromagnetic layer 23. More preferably, the magnitude of the above-mentioned second magnetic field is specified to be larger than the saturation magnetic field of the free magnetic layer 31 and the demagnetizing field of the free magnetic layer 31. In this manner, the exchange-anisotropic magnetic field between the second antiferromagnetic layer 35 and the second free magnetic layer 30 can be directed toward the track-width direction (the X direction shown in the drawing) while the direction of the exchange-anisotropic magnetic field of the first antiferromagnetic layer 23 is directed toward the height direction (the Y direction shown in the drawing). The second heat treatment temperature is, e.g. 250° C., and the magnitude of the magnetic field is 24 kA/m.

Both the side regions 35s and 35s (refer to FIG. 1) of the concave portion 35a of the second antiferromagnetic layer 35 are not cut away by the ion milling, and therefore, have film thicknesses of 80 angstroms to 300 angstroms so as to take on antiferromagnetic property. That is, both the side regions 35s and 35s of the second antiferromagnetic layer 35 are transformed into ordered states by this second magnetic annealing, and therefore, large exchange coupling magnetic fields are generated between both the side regions 35s and 35s of the second antiferromagnetic layer 35 and both the side regions B and B of the free magnetic layer 31. Consequently, the magnetization of both the side regions B and B of the free magnetic layer 31 is pinned in the track-width direction (the X direction shown in the drawing).

On the other hand, since an antiferromagnetic layer having a small film thickness to the extent of taking on no antiferromagnetic property is simply formed on the track-width region A of the free magnetic layer 31, the central portion 35c of the second antiferromagnetic layer 35 provided on the track-width region A of the free magnetic layer 31 is not transformed into an ordered state by even the above-mentioned second magnetic annealing. Therefore, no exchange coupling magnetic field is generated between the central portion 35c of the second antiferromagnetic layer 35 and the free magnetic layer 31. Even when an exchange coupling magnetic field is generated, the value thereof is small. The track-width region A of the above-mentioned free magnetic layer 31 becomes in the condition of being weakly brought into a single domain, so that magnetic reversal can be brought about with respect to an external magnetic field.

When the mask layer 60 is formed from an insulating material, after the mask layer 60 is removed, the second electrode layers 36 and 36 are formed on both the side regions 35s and 35s of the second antiferromagnetic layer 35. However, the second electrode layers 36 and 36 are not necessarily provided.

By using the above-mentioned manufacturing method, a magnetic sensing element, in which a region of the free magnetic layer 31 overlapping the second antiferromagnetic layer includes a region having a film thickness smaller than the film thickness of the track-width region A, can be manufactured.

That is, a magnetic sensing element can be manufactured, in which the film thickness of the region (both side regions) of the free magnetic layer 31 overlapping the second antiferromagnetic layer 35 is made small while the film thickness of the track-width region A of the free magnetic layer 31 is maintained, and therefore, an exchange coupling magnetic field generated between the second antiferromagnetic layer 35 and the free magnetic layer 31 can be increased, and side leading can be reduced.

The magnetic sensing element formed using the present invention can reduce static magnetic fields generated from both the side regions of the free magnetic layer 31. Furthermore, the magnetic flux density in the track-width region A of the free magnetic layer 31 resulting from the static magnetic field can be reduced, a dead zone which occurs in the track-width region A can be reduced, and therefore, the magnetic field detection sensitivity is improved.

In the present invention, successive film formation of the second antiferromagnetic layer 35 to be laminated on the second free magnetic layer 30 can be performed, and it becomes easy to generate an exchange coupling magnetic field required for sufficiently reducing side leading.

In the step shown in FIG. 9, when the spacing W3a in the track-width direction between the inner end surfaces 35b and 35b of both the side regions 35s and 35s of the second antiferromagnetic layer 35 is made smaller than or equal to the dimension W1 in the track-width direction of the first free magnetic layer 29 by adjusting the spacing in the track-width direction between the mask layers 60 and 60, a magnetic sensing element suited for reducing side leading, as is the magnetic sensing element shown in FIG. 1, can be manufactured.

Alternatively, in the step shown in FIG. 9, when the spacing W3b in the track-width direction between the inner end surfaces 35b and 35b of both the side regions 35s and 35s of the second antiferromagnetic layer 35 is made larger than the dimension W1 in the track-width direction of the first free magnetic layer 29 by adjusting the spacing in the track-width direction between the mask layers 60 and 60, a magnetic sensing element suited for improving the magnetic field detection sensitivity (playback output), as is the magnetic sensing element shown in FIG. 2, can be manufactured.

Methods for manufacturing the magnetic sensing elements shown in FIG. 3 and FIG. 4 will be described.

The steps shown in FIG. 6 to FIG. 8 are also performed in the methods for manufacturing the magnetic sensing elements shown in FIG. 3 and FIG. 4.

Figure 10:
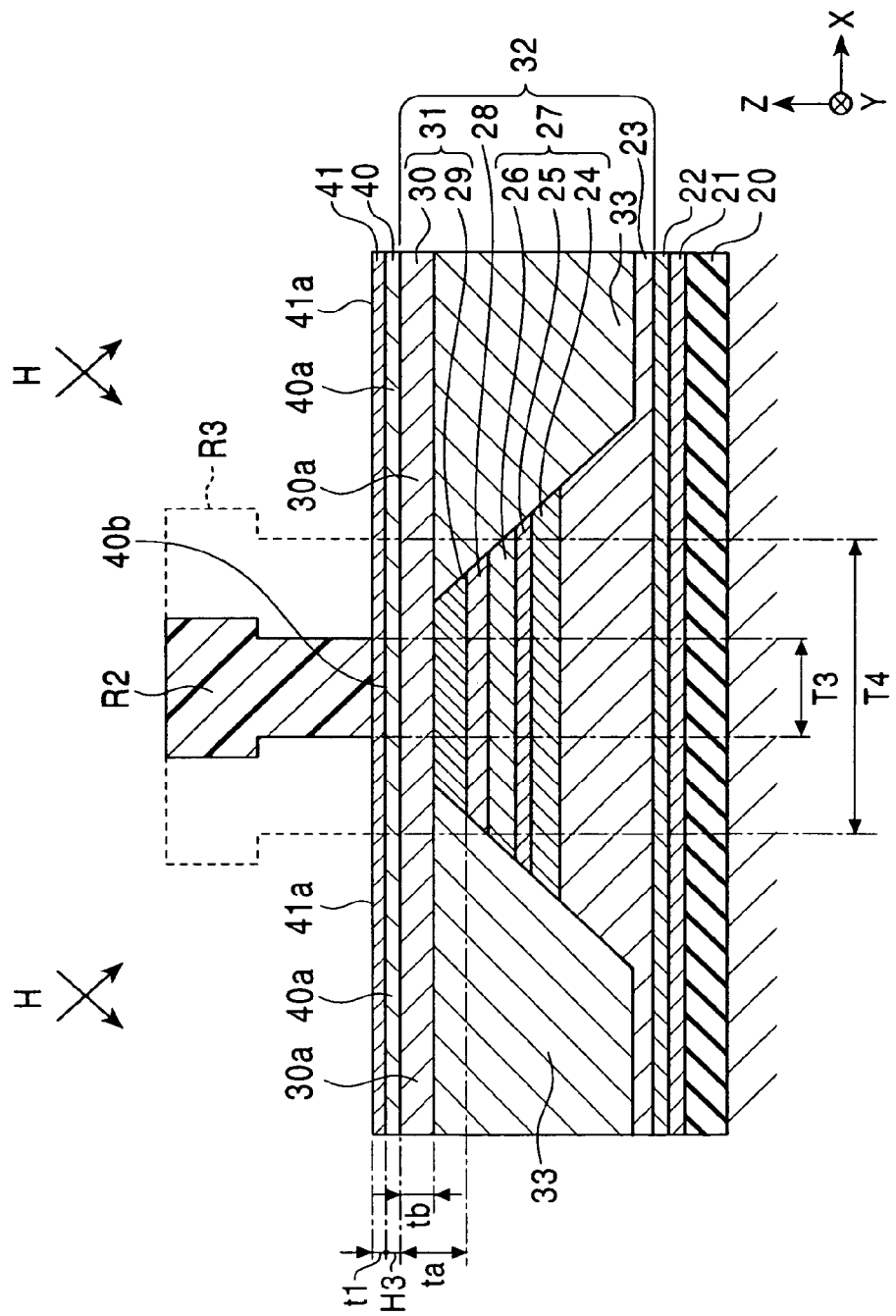
FIG. 10 is a diagram showing a step in the manufacturing process of a magnetic sensing element of the present invention.

After the oxide layers formed on the surfaces of the non-magnetic intermediate layer 34 and the first electrode layers 33 and 33 are removed, in the step shown in FIG. 10, the second free magnetic layer 30 having a dimension W2 in the track-width direction larger than the dimension W1 in the track-width direction of the first free magnetic layer 29 is laminated on the first free magnetic layer 29, and furthermore, successive film formation of the third antiferromagnetic layer 40 and the non-magnetic intermediate layer 41 is performed on the second free magnetic layer 30.

The third antiferromagnetic layer 40 is formed to have a film thickness of 5 angstroms or more, but 50 angstroms or less. More preferable film thickness of the third antiferromagnetic layer 40 is 10 angstroms or more, but 50 angstroms or less, and further preferable film thickness is 30 angstroms or more, but 40 angstroms or less.

A preferable range of the film thickness of the non-magnetic intermediate layer 41 is 2 angstroms to 10 angstroms, and more preferably, is 2 angstroms to 5 angstroms.

The materials for the second free magnetic layer 30, the third antiferromagnetic layer 40 and the non-magnetic intermediate layer 41 are the same as those for the second free magnetic layer 30, the third antiferromagnetic layer 40 and the non-magnetic intermediate layer 41 of the magnetic sensing element shown in FIG. 3.

When the third antiferromagnetic layer 40 is formed to have a small film thickness of 50 angstroms or less, as described above, the third antiferromagnetic layer 40 takes on an antiferromagnetic property. Therefore, the third antiferromagnetic layer 40 is unlikely to be transformed into ordered state even the second magnetic annealing described below is performed. Consequently, no exchange coupling magnetic field is generated between the third antiferromagnetic layer 40 and the free magnetic layer 31 (the second free magnetic layer 30). Even when an exchange coupling magnetic field is generated, the value thereof is small. In this manner, the magnetization of the free magnetic layer 31 is not strongly pinned in contrast to the pinned magnetic layer 27.

The third antiferromagnetic layer 40 is formed to have a film thickness of 5 angstroms or more, and preferably, 10 angstroms or more. This is because when the film thickness is smaller than the above-mentioned extent, even the second antiferromagnetic layers 42 and 42 are formed on both the side regions 40a and 40a of the third antiferromagnetic layer 40 in a downstream step, both the side regions 40a and 40a of the third antiferromagnetic layer 40 are unlikely to take on an antiferromagnetic property, and no exchange coupling magnetic field having an appropriate magnitude is generated between both the side regions 40a and 40a of the third antiferromagnetic layer 40 and both the side regions B and B of the free magnetic layer 31.

The non-magnetic intermediate layer 41 has the function as a protective layer provided for preventing oxidation of the third antiferromagnetic layer 40 due to exposure to air.

The non-magnetic intermediate layer 41 is formed from Cr or at least one noble metal selected from the group consisting of Ru, Re, Pd, Os, Ir, Pt, Au and Rh.

These materials are unlikely to oxidize due to exposure to air compared with a Ta film conventionally used as an oxidation-protective film, or are materials in which oxidization is unlikely to proceed in the film thickness direction even when oxidized. The oxidation of the third antiferromagnetic layer 40 can be appropriately prevented in spite of a small film thickness of 2 angstroms or more, but 10 angstroms or less, and more preferably, 2 angstroms or more, but 5 angstroms or less.

The elements constituting the non-magnetic intermediate layer 41 diffuse into the third antiferromagnetic layer during the second magnetic annealing step described below. The diffusion of the elements constituting the non-magnetic intermediate layer 41 can be measured by, e.g. EDX analysis with an SIMS analyzer or a transmission electron microscope.

A resist layer is formed on the non-magnetic intermediate layer 41, and this resist layer is exposed, followed by development, so that a resist layer R2 in the shape shown in FIG. 10 is left on the non-magnetic intermediate layer 41. The resist layer R2 is formed on a region overlapping the first free magnetic layer 29, and covers a region having a width dimension T3 in the track-width direction. The resist layer R2 is, for example, a resist layer for lift-off.

A part of both the side regions 41a and 41a of the non-magnetic intermediate layer 41, which are not covered with the resist layer R2, is cut away by ion milling from the direction indicated by arrows H shown in FIG. 10.

In the present invention, preferably, the film thicknesses of both the side regions 41a and 41a of the non-magnetic intermediate layer 41 are made to be 3 angstroms or less in this ion milling step, and more preferably, be 1.0 angstrom or less. By reducing the film thicknesses of both the side regions 41a and 41a of the non-magnetic intermediate layer 41 to such an extent, when the second antiferromagnetic layers 42 and 42 are formed on both the side regions 40a and 40a of the third antiferromagnetic layer 40 in the following step, antiferromagnetic interactions can be generated between both the side regions 40a and 40a of the third antiferromagnetic layer 40 and the second antiferromagnetic layers 42 and 42, and both the side regions 40a and 40a of the third antiferromagnetic layer 40 and the second antiferromagnetic layers 42 and 42 are made to perform a function as an integrated antiferromagnetic layer. Consequently, both the side regions 40a and 40a of the third antiferromagnetic layer 40 are made to take on an antiferromagnetic property. Preferably, both the side regions 41a and 41a of the non-magnetic intermediate layer 41 are left while having an average film thickness of 0.2 angstroms or more in order to protect the surfaces of both the side regions 40a and 40a of the third antiferromagnetic layer 40. However, the non-magnetic intermediate layer 41 may be completely removed.

In the ion milling step shown in FIG. 10, low-energy ion milling can be used. The reason for this is that the non-magnetic intermediate layer 41 is formed to have a very small film thickness in the order of 2 angstroms to 10 angstroms, more preferably, in the order of 2 angstroms to 5 angstroms, and the film thickness of the oxide layer formed on the surface of the non-magnetic intermediate layer 41 can be controlled at 3 angstroms to 6 angstroms because the non-magnetic intermediate layer 41 is formed from a material unlikely to oxidize.

Even when the non-magnetic intermediate layer 41 has a small film thickness as described above, oxidation of the third antiferromagnetic layer 40 can be sufficiently prevented, and it is easy to control the milling because of low-energy ion milling, so that the milling can be stopped at a midway through the non-magnetic intermediate layer 41 or at the top surface of the third antiferromagnetic layer 40.

Consequently, degradation of the antiferromagnetic characteristics of the third antiferromagnetic layer 40 due to cutting away of the surface of the third antiferromagnetic layer 40 during the ion milling step can be prevented. It is verified that antiferromagnetic interactions generated between both the side regions 40a and 40a of the third antiferromagnetic layer 40 and the second antiferromagnetic layers 42 and 42 formed thereon can be thereby enhanced, and exchange coupling magnetic fields generated between both the side regions 40a and 40a of the third antiferromagnetic layer 40 and both the side regions 30a and 30a of the second free magnetic layer 30 can be enhanced.

The low-energy ion milling is defined as ion milling using an ion beam with a beam voltage (acceleration voltage) of less than 100 V. For example, a beam voltage of 100 V to 500 V is used. In the present embodiment, an argon (Ar) ion beam with a low beam voltage of 200 V is used. In this manner, the low-energy ion milling can be used in the present invention, and therefore, the milling control can be improved compared with that heretofore attained.

Preferably, the milling is performed for a milling time in the order of 20 seconds to 40 seconds at a milling angle of 30° to 70°, and more preferably, 40° to 60°, which is the inclination with respect to the direction perpendicular to the surface of the non-magnetic intermediate layer 41.

On the other hand, when conventionally, commonly used Ta, for example, is used as the non-magnetic intermediate layer 41, since high-energy ion milling is required, it becomes very difficult to control the milling in order that the non-magnetic intermediate layer 41 is simply removed. As a result, a part of the surface of the third antiferromagnetic layer 40 provided under the non-magnetic intermediate layer 41 is also cut away, and therefore, the antiferromagnetic characteristics of the third antiferromagnetic layer are degraded.

Figure 11:
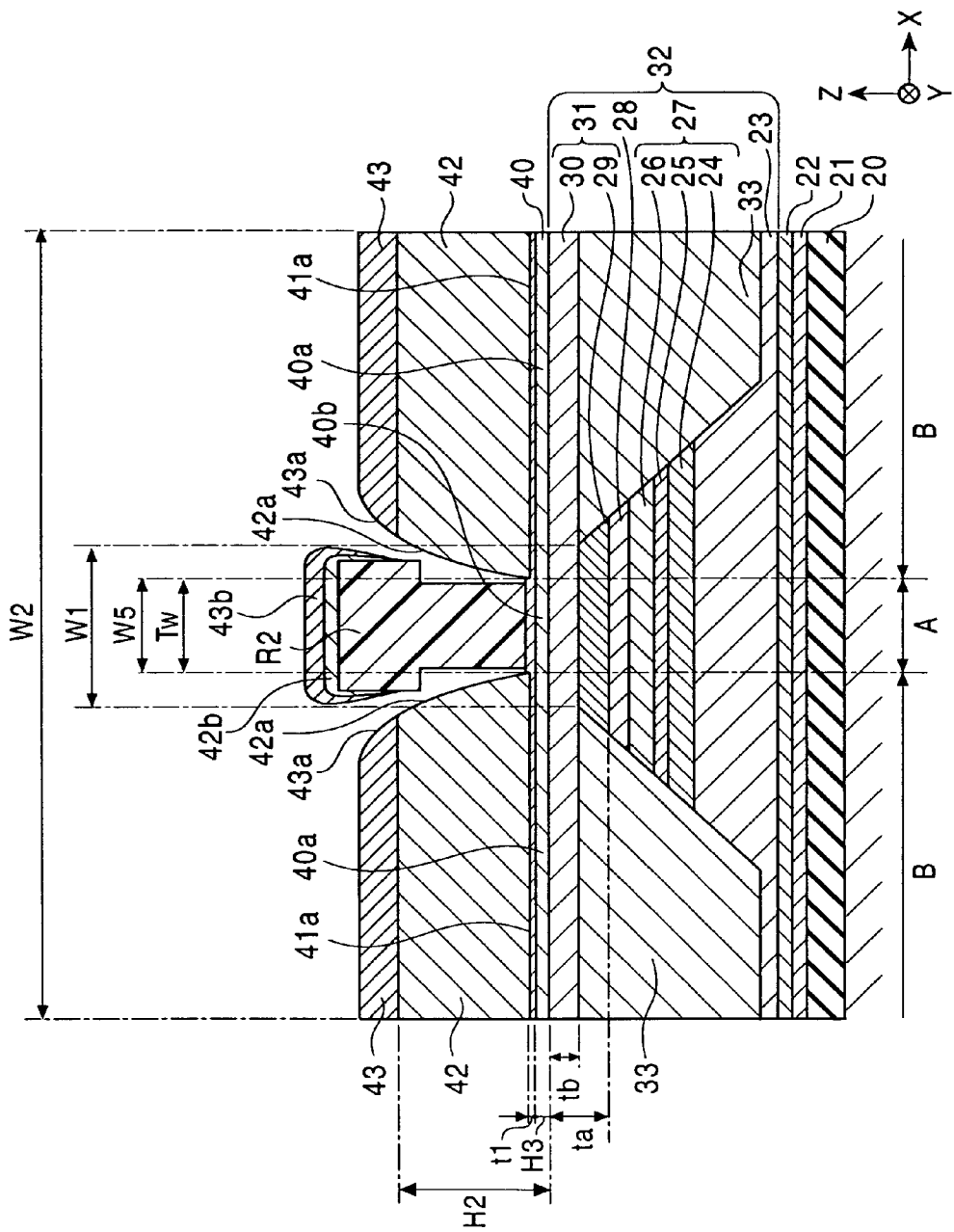
FIG. 11 is a diagram showing a step in the manufacturing process of a magnetic sensing element of the present invention.

The step shown in FIG. 11 is performed. In the step shown in FIG. 11, successive film formation of the second antiferromagnetic layers 42 and 42 and the second electrode layers 43 and 43 is performed on both the side regions 41a and 41a of the non-magnetic intermediate layer 41. Sputtering or evaporation is used for the film formation. The inner end surfaces 42a and 42a of the resulting second antiferromagnetic layers 42 and 42 and the inner end surfaces 43a and 43a of the resulting second electrode layers 43 and 43 are formed from inclined surfaces or curved surfaces while the spacing between the second antiferromagnetic layers 42 and 42 gradually increases from the bottom surface toward the top surface (the Z direction shown in the drawing).

The second electrode layers 43 and 43 may not be provided.

In the present embodiment, the track-width dimension Tw is defined by the spacing (=W5) between the bottom surfaces of the second antiferromagnetic layers 42 and 42.

Preferably, the material used for the second antiferromagnetic layers 42 and 42 is the same as the antiferromagnetic material used for the third antiferromagnetic layer 40.

In the step shown in FIG. 11, preferably, the film thicknesses of the second antiferromagnetic layers 42 and 42 are adjusted in order that the total film thickness of the second antiferromagnetic layers 42 and 42 and both the side regions 40a and 40a of the third antiferromagnetic layer 40 provided thereunder becomes a large film thickness of 80 angstroms or more, but 300 angstroms or less.

This is because when the total film thickness of the third antiferromagnetic layer 40 and the second antiferromagnetic layers 42 and 42 is made to be a large film thickness in the order of 80 angstroms or more, but 300 angstroms or less, both the side regions 40a and 40a of the third antiferromagnetic layer 40, which have no antiferromagnetic property on a stand-alone basis, take on an antiferromagnetic property.

As shown in FIG. 11, after up to the second electrode layers 43 and 43 are formed by lamination, the above-mentioned resist layer R2, to which a film 42b of an antiferromagnetic material composed of elements constituting the second antiferromagnetic layers 42 and 42 and a film 43b of an electrode material composed of elements constituting the second electrode layers 43 and 43 have adhered, is removed by lift-off.

The second magnetic annealing is performed. At this time, the direction of the magnetic field is the track-width direction (the X direction shown in the drawing). In this second magnetic annealing, the second-applied magnetic field is made smaller than the exchange-anisotropic magnetic field of the first antiferromagnetic layer 23, and in addition, the heat treatment temperature is made lower than the blocking temperature of the first antiferromagnetic layer 23. More preferably, the magnitude of the above-mentioned second-applied magnetic field is made larger than the saturation magnetic field of the free magnetic layer 31 and the demagnetizing field of the free magnetic layer 31. In this manner, the exchange-anisotropic magnetic field between the third antiferromagnetic layer 40 and the free magnetic layer 31 can be directed toward the track-width direction (the X direction shown in the drawing) while the direction of the exchange-anisotropic magnetic field of the first antiferromagnetic layer 23 is directed toward the height direction (the Y direction shown in the drawing). The second heat treatment temperature is, e.g. 250° C., and the magnitude of the magnetic field is 24 kA/m.

When the second antiferromagnetic layers 42 and 42 are formed on both the side regions 40a and 40a of the third antiferromagnetic layer with the non-magnetic intermediate layer 41 therebetween, as described above, antiferromagnetic interactions between both the side regions 40a and 40a of the third antiferromagnetic layer 40 and the second antiferromagnetic layers 42 and 42 can be thereby enhanced, and both the side regions 40a and 40a of the third antiferromagnetic layer 40, which have no antiferromagnetic property on a stand-alone basis, take on an antiferromagnetic property.

That is, both the side regions 40s and 40s of the third antiferromagnetic layer 40 are appropriately transformed into ordered states by the above-mentioned second magnetic annealing, and therefore, an appropriate magnitude of exchange coupling magnetic field is generated between both the side regions 40a and 40a of the third antiferromagnetic layer 40 and both the side regions B and B of the free magnetic layer 31. Consequently, the magnetization of both the side regions B and B of the free magnetic layer 31 is pinned in the track-width direction (the X direction shown in the drawing).

On the other hand, no exchange coupling magnetic field is generated between the central portion 40b of the third antiferromagnetic layer 40, on which the second antiferromagnetic layers 42 and 42 are not laminated, and the track-width region A of the free magnetic layer 31. Even when an exchange coupling magnetic field is generated, the value thereof is small. Consequently, the magnetization of the track-width region A of the free magnetic layer 31 becomes in the condition of being weakly brought into a single domain, so that magnetic reversal can be brought about with respect to an external magnetic field.

In the above-mentioned second magnetic annealing, it is believed that the elements constituting the non-magnetic intermediate layer 41 diffuse into the third antiferromagnetic layer 40, and furthermore, into the second antiferromagnetic layers 42 and 42. Consequently, the constituent elements of the third antiferromagnetic layer 40 and the second antiferromagnetic layers 42 and 42 after the heat treatment are composed of the elements constituting the antiferromagnetic layer and the elements constituting the non-magnetic intermediate layer 41. The elements constituting the non-magnetic intermediate layer 41 diffused into the third antiferromagnetic layer 40 and the second antiferromagnetic layers 42 and 42 are present in the surface side of the third antiferromagnetic layer 40 at a content higher than that in the bottom surface side of the third antiferromagnetic layer 40, and are present in the bottom surface side of the second antiferromagnetic layers 42 and 42 at a content higher than that in the surface side. It is believed that the compositional ratio of the diffused elements constituting the non-magnetic intermediate layer gradually decrease from the surface of the third antiferromagnetic layer 40 toward the bottom surface, and from the bottom surfaces of the second antiferromagnetic layers 42 and 42 toward the surfaces. Such a compositional modulation can be verified by, e.g. EDX analysis with an SIMS analyzer or a transmission electron microscope.

By using the above-mentioned manufacturing method, a magnetic sensing element, in which regions (both the side regions B and B) of the free magnetic layer 31 overlapping the second antiferromagnetic layers 42 and 42 include regions having a film thickness smaller than the film thickness of the track-width region A, can be manufactured.

That is, a magnetic sensing element can be manufactured, in which the film thicknesses of the regions (both the side regions B and B) of the free magnetic layer 31 overlapping the second antiferromagnetic layers 42 and 42 are made small while the film thickness of the track-width region A of the free magnetic layer 31 is maintained, and therefore, exchange coupling magnetic fields generated between the second antiferromagnetic layers 42 and 42 and the free magnetic layer 31 can be increased, and side leading can be reduced.

The magnetic sensing element formed using the present invention can reduce static magnetic fields generated from both the side regions of the free magnetic layer 31. Furthermore, the magnetic flux density in the track-width region A of the free magnetic layer 31 resulting from the static magnetic field can be reduced, a dead zone which occurs in the track-width region A can be reduced, and therefore, the magnetic field detection sensitivity is improved.

In the present invention, successive film formation of the third antiferromagnetic layer 40 can be performed on the second free magnetic layer 30, and it becomes easy to generate an exchange coupling magnetic field required for sufficiently reducing side leading.

In the step shown in FIG. 11, when the spacing W5 in the track-width direction between the second antiferromagnetic layers 42 and 42 is made smaller than or equal to the dimension W1 in the track-width direction of the first free magnetic layer 29, a magnetic sensing element suited for reducing side leading, as is the magnetic sensing element shown in FIG. 3, can be manufactured.

Alternatively, in the step shown in FIG. 10, when the spacing W5 in the track-width direction between the second antiferromagnetic layers 42 and 42 is made larger than the dimension W1 in the track-width direction of the first free magnetic layer 29 by forming a resist layer R3 which covers a region having a dimension T4 in the track-width direction larger than the resist layer R2, a magnetic sensing element suited for improving the magnetic field detection sensitivity (playback output), as is the magnetic sensing element shown in FIG. 4, can be manufactured.

A method for manufacturing the magnetic sensing element shown in FIG. 5 will be described.

The steps shown in FIG. 6 to FIG. 8 are also performed in the method for manufacturing the magnetic sensing element shown in FIG. 5.

Figure 12:
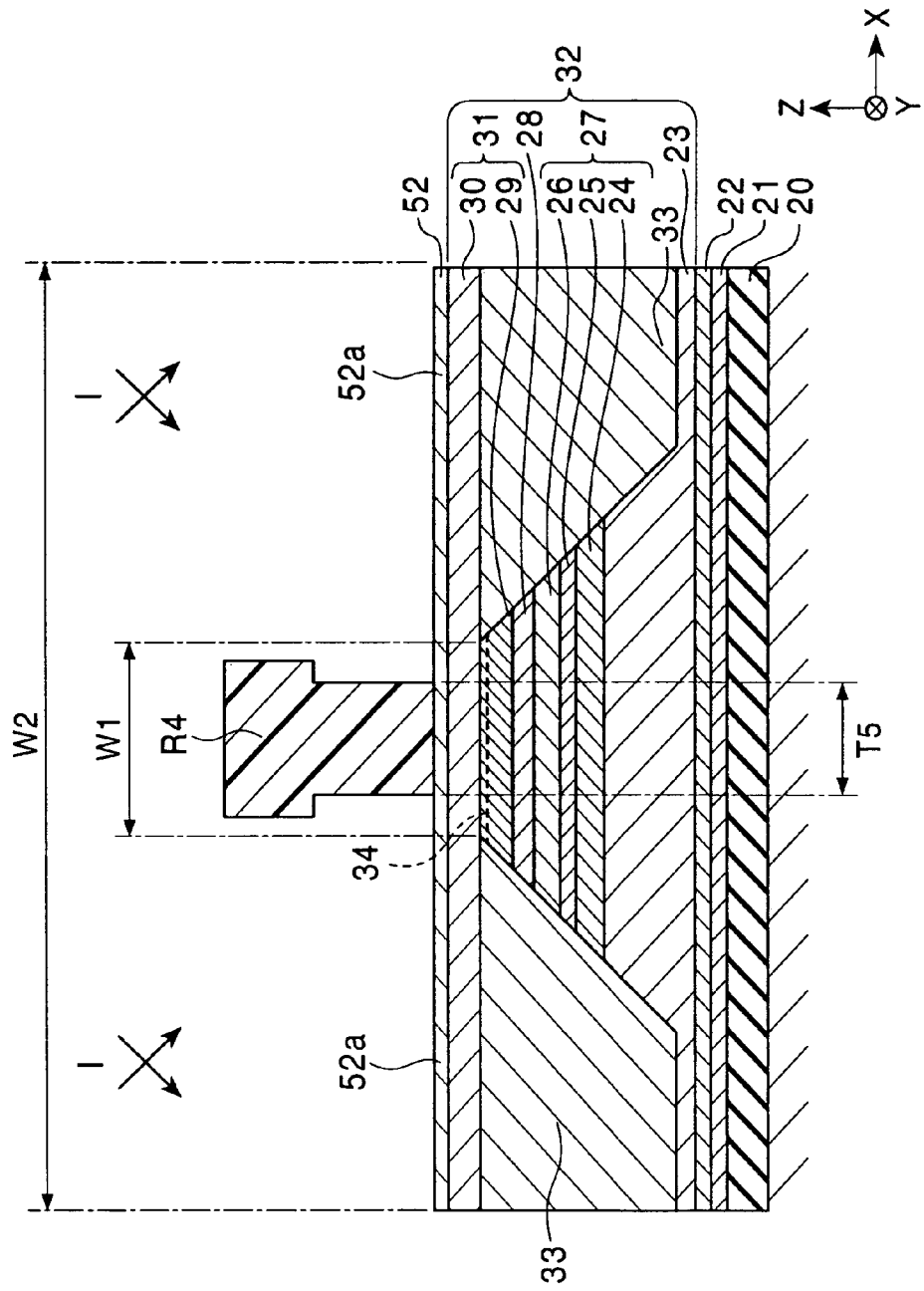
FIG. 12 is a diagram showing a step in the manufacturing process of a magnetic sensing element of the present invention.

After the oxide layers formed on the surfaces of the non-magnetic intermediate layer 34 and the first electrode layers 33 and 33 are removed in the step shown in FIG. 8, the second free magnetic layer 30 having a dimension W2 in the track-width direction larger than the dimension W1 in the track-width direction of the first free magnetic layer 29 is laminated on the first free magnetic layer 29, and furthermore, successive film formation of the non-magnetic intermediate layer 52 is performed on the second free magnetic layer 30, as shown in FIG. 12.

The non-magnetic intermediate layer 52 has the function as a protective layer provided for preventing oxidation of the second free magnetic layer 30 due to exposure to air.

The non-magnetic intermediate layer 52 is formed from Cr or at least one noble metal selected from the group consisting of Ru, Re, Pd, Os, Ir, Pt, Au, Rh and Cu.

These materials are unlikely to oxidize due to exposure to air compared with a Ta film conventionally used as an oxidation-protective film, or are materials in which oxidization is unlikely to proceed in the film thickness direction even when oxidized. The oxidation of the second free magnetic layer 30 can be appropriately prevented in spite of a small film thickness of 2 angstroms or more, but 10 angstroms or less, and more preferably, 2 angstroms or more, but 5 angstroms or less.

A resist layer is formed on the non-magnetic intermediate layer 52, and this resist layer is exposed, followed by development, so that a resist layer R4 in the shape shown in FIG. 12 is left on the non-magnetic intermediate layer 52. The resist layer R4 is formed on a region overlapping the first free magnetic layer 29, and covers a region having a width dimension T5 in the track-width direction. The resist layer R1 is, for example, a resist layer for lift-off.

A part of both the side regions 52a and 52a of the non-magnetic intermediate layer 52, which are not covered with the resist layer R1, is cut away by ion milling from the direction indicated by arrows I shown in FIG. 12. In the ion milling step shown in FIG. 12 as well, the above-mentioned low-energy ion milling is used.

In the present invention, preferably, the film thicknesses of both the side regions 52a and 52a of the non-magnetic intermediate layer 52 are made to be 3 angstroms or less in this ion milling step, and more preferably, be 1.0 angstrom or less.

Preferably, 0.2 µm or more of the non-magnetic intermediate layer 52 is left in order to prevent degradation of the magnetic characteristics due to cutting away of the surface of the second free magnetic layer 30.

However, since the above-mentioned low-energy ion milling can be used in the ion milling step shown in FIG. 12 as well, the milling step can be stopped at the top surface of the second free magnetic layer 30 in order that the non-magnetic intermediate layer is completely removed, while the degradation of the magnetic characteristics of the second free magnetic layer 30 can be reduced.

Preferably, the milling is performed for a milling time in the order of 20 seconds to 40 seconds at a milling angle of 30° to 70°, and more preferably, 40° to 60°, which is the inclination with respect to the direction perpendicular to the surface of the non-magnetic intermediate layer 52.

Figure 13:
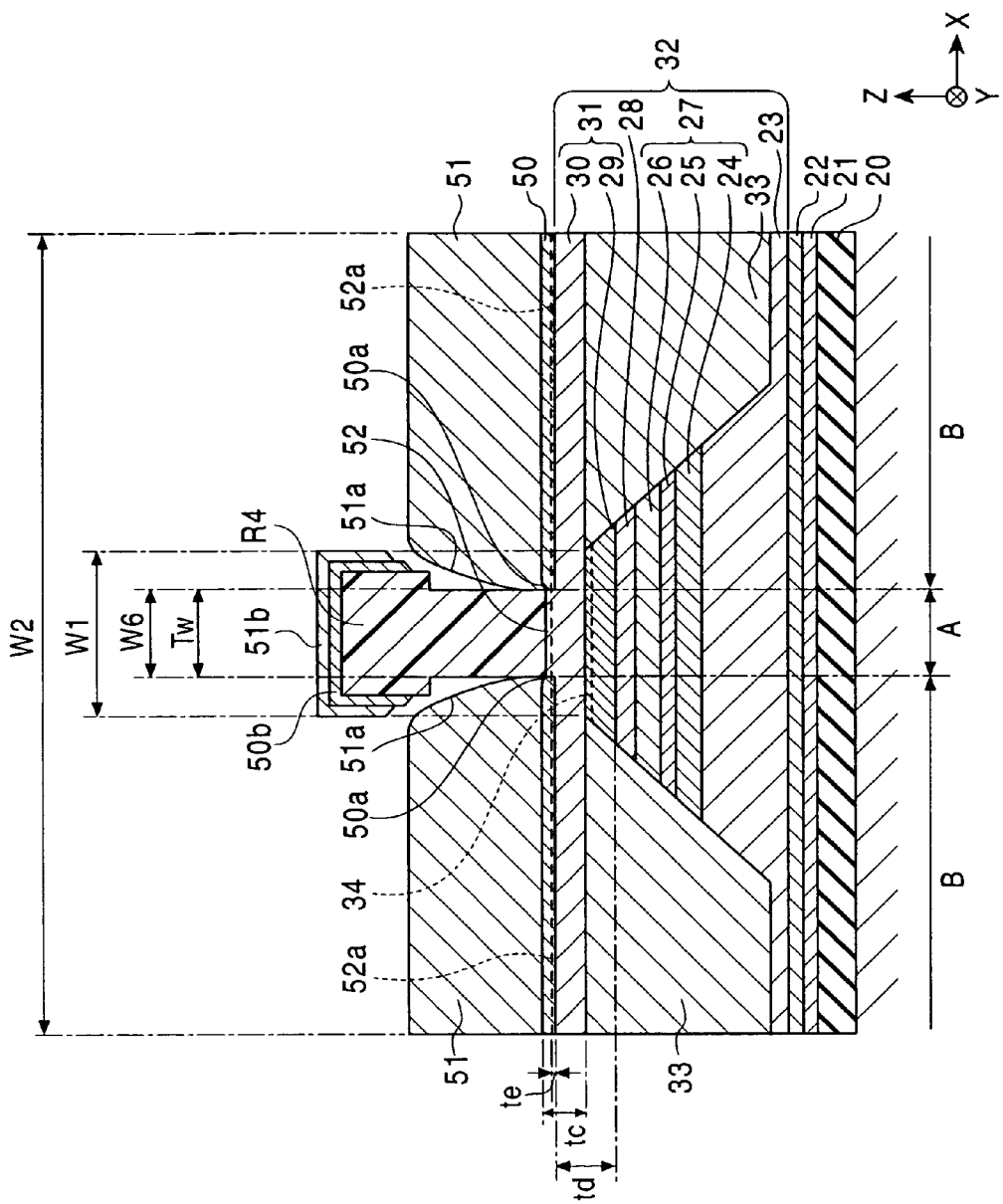
FIG. 13 is a diagram showing a step in the manufacturing process of a magnetic sensing element of the present invention.

The step shown in FIG. 13 is performed. Successive film formation of the ferromagnetic layers 50 and 50 and the second antiferromagnetic layers 51 and 51 is performed on both the side regions 52a and 52a of the non-magnetic intermediate layer 52 in the step shown in FIG. 13. A sputtering method or an evaporation method is used for the film formation. The inner end surfaces 50a and 50a of the resulting ferromagnetic layers 50 and 50 and the inner end surfaces 51a and 51a of the resulting second antiferromagnetic layers 51 and 51 are formed from inclined surfaces or curved surfaces while the spacing between the second antiferromagnetic layers 51 and 51 gradually increases from the bottom surface toward the top surface (the Z direction shown in the drawing).

In the present embodiment, the total film thickness tc of the film thickness of the ferromagnetic layer 50 and the film thickness of the second free magnetic layer 30 is made smaller than the total film thickness td of the film thickness of the first free magnetic layer 29 and the film thickness of the second free magnetic layer 30.

Second electrode layers similar to those in the magnetic sensing element shown in FIG. 3 may be formed on the second antiferromagnetic layers 51 and 51.

In the present embodiment, the track-width dimension Tw is defined by the spacing (=W6) between the bottom surfaces of the second antiferromagnetic layers 51 and 51.

Preferably, the material used for the second antiferromagnetic layers 51 and 51 is the same as the antiferromagnetic material used for the first antiferromagnetic layer 23.

In the step shown in FIG. 13, when the second antiferromagnetic layers 51 and 51 are made to have large film thicknesses of 80 angstroms or more, but 300 angstroms or less, the second antiferromagnetic layers 51 and 51 can be made to take on an antiferromagnetic property.

After up to the second antiferromagnetic layers 51 and 51 are formed by lamination, the resist layer R4, to which a film 50b of a ferromagnetic material composed of elements constituting the ferromagnetic layers 50 and 50 and a film 51b of an antiferromagnetic material composed of elements constituting the second antiferromagnetic layers 51 and 51 have adhered, is removed by lift-off.

The second magnetic annealing is performed. At this time, the direction of the magnetic field is the track-width direction (the X direction shown in the drawing). In this second magnetic annealing, the second-applied magnetic field is made smaller than the exchange-anisotropic magnetic field of the first antiferromagnetic layer 23, and in addition, the heat treatment temperature is made lower than the blocking temperature of the first antiferromagnetic layer 23. More preferably, the magnitude of the above-mentioned second magnetic field is made larger than the saturation magnetic field of the free magnetic layer 31 and the demagnetizing field of the free magnetic layer 31. In this manner, the exchange-anisotropic magnetic fields between the second antiferromagnetic layers 51 and 51 and the ferromagnetic layers 50 and 50 can be directed toward the track-width direction (the X direction shown in the drawing) while the direction of the exchange-anisotropic magnetic field of the first antiferromagnetic layer 23 is directed toward the height direction (the Y direction shown in the drawing). The second heat treatment temperature is, e.g. 250° C., and the magnitude of the magnetic field is 24 kA/m.

When the non-magnetic intermediate layer 52 is not present between the second free magnetic layer 30 and the ferromagnetic layer 50, or when the non-magnetic intermediate layer 52 is present while the film thickness thereof (the film thicknesses of both the side regions 52a and 52a of the non-magnetic intermediate layer 52 overlapping the ferromagnetic layers 50 and 50) is within the range of 0.2 angstroms to 5 angstroms, the second free magnetic layer 30 and the ferromagnetic layer 50 can be made to function as integrated ferromagnetism. At this time, the magnetization of both the side regions B and B of the free magnetic layer 31 is pinned in the same direction as the magnetization direction of the ferromagnetic layers 50 and 50, for example, in the track-width direction (the X direction shown in the drawing).

Alternatively, when the film thickness of the non-magnetic intermediate layer 52 present between the second free magnetic layer 30 and the ferromagnetic layer 50 (the film thicknesses of both the side regions 52a and 52a of the non-magnetic intermediate layer 52) is within the range of 5 angstroms to 11 angstroms, the second free magnetic layer 30 and the ferromagnetic layer 50 constitute a synthetic, ferrimagnetic structure, and therefore, the magnetization of both the side regions B and B of the second free magnetic layer 30 is strongly pinned.

On the other hand, the track-width region A of the free magnetic layer 31 is sandwiched between both the side regions B and B overlapping the second antiferromagnetic layers 51 and 51 and the ferromagnetic layers 50 and 50, and the magnetization of the track-width region A of the free magnetic layer 31 becomes in the condition of being weakly brought into a single domain, so that magnetic reversal can be brought about with respect to an external magnetic field.

In the above-mentioned second magnetic annealing, it is believed that the elements constituting the non-magnetic intermediate layer 52 diffuse into the ferromagnetic layers 50 and 50, and furthermore, into the second antiferromagnetic layers 51 and 51. Consequently, the constituent elements of the ferromagnetic layers 50 and 50 and the second antiferromagnetic layers 51 and 51 after the heat treatment are composed of the elements constituting the antiferromagnetic layer and the elements constituting the non-magnetic intermediate layer 52. The elements constituting the non-magnetic intermediate layer 52 diffused into the ferromagnetic layers 50 and 50 and the second antiferromagnetic layers 51 and 51 are present in the bottom surface side of the ferromagnetic layers 50 and 50 at a content higher than that in the surface side of the ferromagnetic layers 50 and 50, and are present in the bottom surface side of the second antiferromagnetic layers 51 and 51 at a content higher than that in the surface side. It is believed that the compositional ratio of the diffused elements constituting the non-magnetic intermediate layer 52 gradually decrease from the bottom surfaces of the ferromagnetic layers 50 and 50 toward the surfaces, and from the bottom surfaces of the second antiferromagnetic layers 51 and 51 toward the surfaces. Such a compositional modulation can be verified by, e.g. EDX analysis with an SIMS analyzer or a transmission electron microscope.

According to the manufacturing method of the present embodiment as well, a magnetic sensing element can be manufactured, in which the film thicknesses of the regions (both the side regions B and B) of the free magnetic layer 31 overlapping the second antiferromagnetic layers 51 and 51 are made small while the film thickness of the track-width region A of the free magnetic layer 31 is maintained, exchange coupling magnetic fields generated between the second antiferromagnetic layers 51 and 51 and the free magnetic layer 31 can be increased, and therefore, side leading can be reduced.

The magnetic sensing element formed using the present invention can reduce static magnetic fields generated from both the side regions of the free magnetic layer 31. Furthermore, the magnetic flux density in the track-width region A of the free magnetic layer 31 resulting from the static magnetic field can be reduced, a dead zone which occurs in the track-width region A can be reduced, and therefore, the magnetic field detection sensitivity is improved.

In the present invention, successive film formation of the second antiferromagnetic layers 51 and 51 can be performed on the ferromagnetic layers 50 and 50, and it becomes easy to generate an exchange coupling magnetic field required for sufficiently reducing side leading.

In the step shown in FIG. 13, when the spacing W6 in the track-width direction between the second antiferromagnetic layers 51 and 51 is made smaller than or equal to the dimension W1 in the track-width direction of the first free magnetic layer 29, a magnetic sensing element suited for reducing side leading, as is the magnetic sensing element shown in FIG. 3, can be manufactured.

Alternatively, in the step shown in FIG. 12, when the spacing in the track-width direction between the second antiferromagnetic layers 51 and 51 is made larger than the dimension W1 in the track-width direction of the first free magnetic layer 29 by forming a resist layer which covers a region having a dimension in the track-width direction larger than the resist layer R4, a magnetic sensing element suited for improving the magnetic field detection sensitivity (playback output) can be manufactured.

[Examples]

A magnetic sensing element similar to that shown in FIG. 1 was prepared, and the relationship between [(the difference calculated by subtracting the film thickness ta of the free magnetic layer in the track-width region A from the film thickness tb of the free magnetic layer 31 in both side regions B and B)/the film thickness ta of the free magnetic layer in the track-width region A]×100 (%) (hereafter briefly referred to as "ratio") and the playback output was studied.

Figure 14:
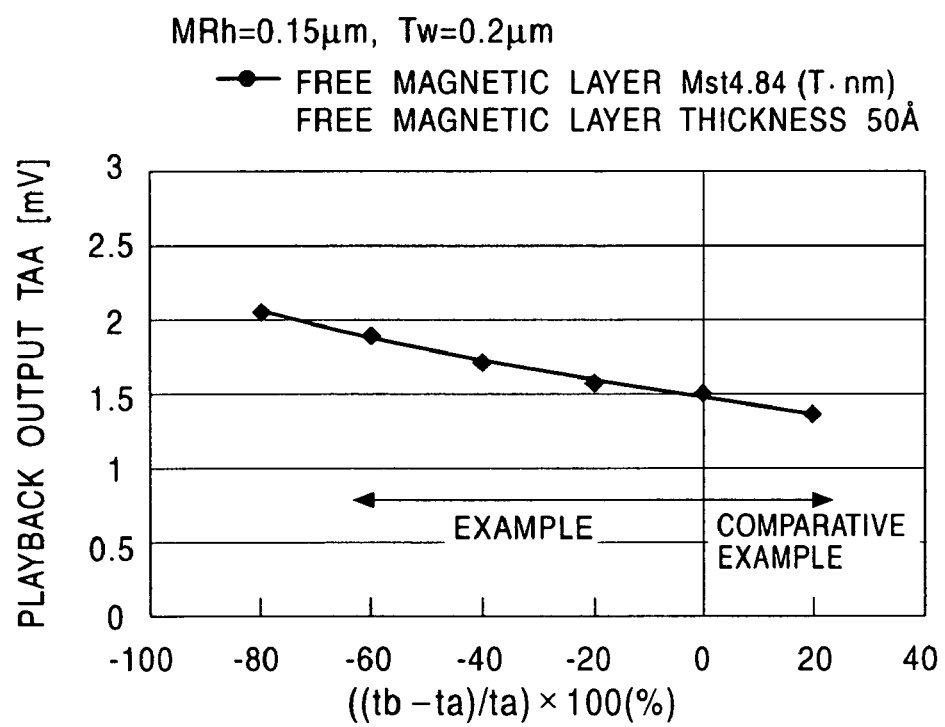
FIG. 14 is a graph showing changes in playback output with changes in the film thickness tb of the free magnetic layer 31 in both side regions B and B and changes in the film thickness ta of the free magnetic layer in the track-width region A.
Figure 15:
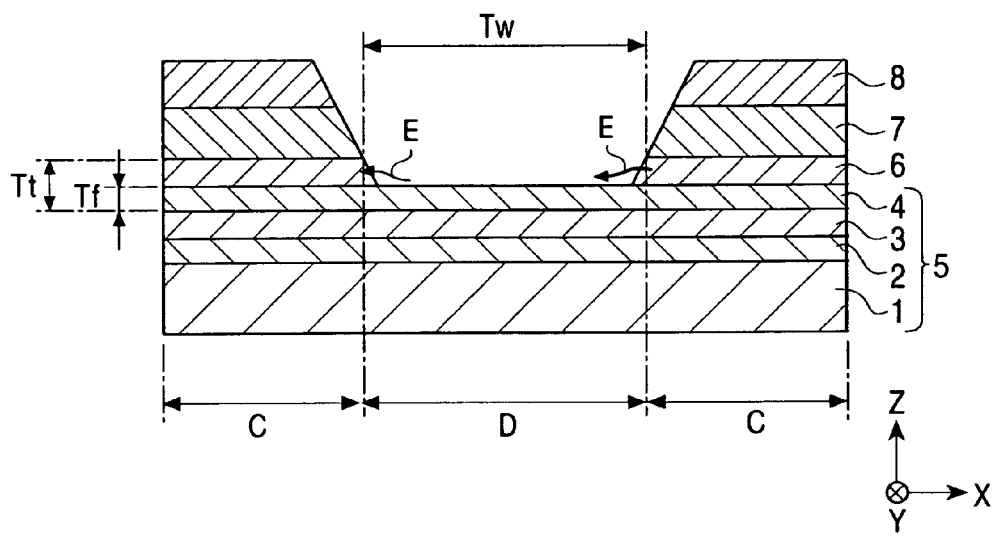
FIG. 15 is a partial sectional view of the structure of a conventional magnetic sensing element, viewed from the side of a surface facing a recording medium.
Figure 16:
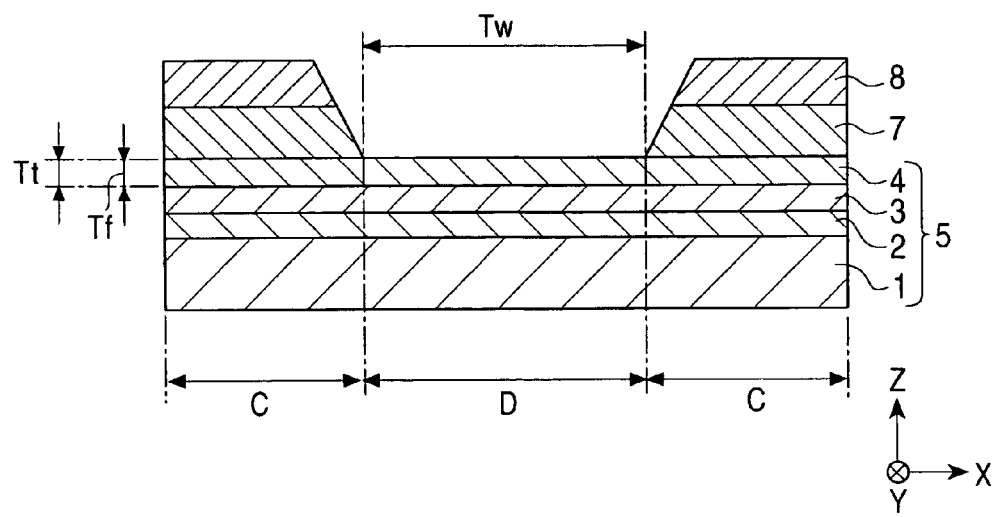
FIG. 16 is a partial sectional view of the structure of a conventional magnetic sensing element, viewed from the side of a surface facing a recording medium.

In a magnetic sensing element used in the experiment, the film thickness ta of the free magnetic layer 31 in the track-width region A (the total film thickness of the first free magnetic layer 29 and the second free magnetic layer 30) was 50 angstroms, the track-width dimension Tw was 0.2 $\mu$m, and the MR height (the length in the Y direction of the magnetic sensing element shown in FIG. 1) was 0.15 $\mu$m. A CoFe alloy and a NiFe alloy were used for the first free magnetic layer 29 and the second free magnetic layer 30 constituting the free magnetic layer 31, and the magnetic moment of the free magnetic layer 31 was 4.84 (T·nm) on a unit area basis. In the experiment, the film thickness tb of both the side regions B and B of the free magnetic layer 31 was changed, and the relationship between the above-mentioned ratio and the playback output was studied. The result is shown in FIG. 14.

When the film thickness tb of the free magnetic layer 31 in both the side regions B and B and the film thickness ta in the track-width region A are equal, the playback output is 1.5 mV. When the film thickness tb of the free magnetic layer 31 in both the side regions B and B is made larger than the film thickness ta in the track-width region A in a manner similar to that in the conventional magnetic sensing element, that is, when the above-mentioned ratio is made to be a positive value (Comparative example), the playback output becomes small.

On the other hand, it was made clear that when the film thickness tb of the free magnetic layer 31 in both the side regions B and B was made smaller than the film thickness ta in the track-width region A as in the present invention, that is, when the above-mentioned ratio was made to be a negative value (Examples), the playback output became large.

When the film thickness ta in the track-width region A of the free magnetic layer 31 exceeds 50 angstroms, the playback sensitivity is reduced. Therefore, preferably, the film thickness ta is 50 angstroms or less.

When the film thickness tb of the free magnetic layer 31 in both the side regions B and B is less than 10 angstroms, the exchange coupling magnetic fields between the second antiferromagnetic layer 35 and both the side regions B and B become small. Therefore, preferably, the film thickness tb is 10 angstroms or more.

Consequently, the lower limit value of the above-mentioned ratio is specified to be −80%, and the preferable range of the above-mentioned ratio is specified to be within the range of −80% or more, but less than 0.

The present invention was described above with reference to preferred examples. However, various modifications can be made within the scope of the present invention.

The above-mentioned examples are no more than exemplifications, and therefore, do not limit the scope of the present invention.

In the present invention described above in detail, the film thickness of the region (both the side regions) of the above-mentioned free magnetic layer overlapping the above-mentioned second antiferromagnetic layer is reduced while the film thickness of the track-width region of the above-mentioned free magnetic layer is maintained, an exchange coupling magnetic field generated between the above-mentioned second antiferromagnetic layer and the free magnetic layer can be increased, and therefore, side leading can be reduced.

Static magnetic fields generated from both the side regions of the above-mentioned free magnetic layer can be reduced by reducing the film thicknesses of both the above-mentioned side regions.

In the present invention, the magnetic flux density in the track-width region of the above-mentioned free magnetic layer resulting from the static magnetic fields generated from both the side regions of the above-mentioned free magnetic layer can be reduced, a dead zone which occurs in the above-mentioned track-width region can be reduced, and therefore, the magnetic field detection sensitivity is improved.

Regarding the structure, when the above-mentioned second free magnetic layer is laminated on the above-mentioned first free magnetic layer, as in the present invention, successive film formation of the above-mentioned second free magnetic layer or the ferromagnetic layer laminated on the above-mentioned second free magnetic layer and the antiferromagnetic layer laminated thereon can be performed, and therefore, it becomes easy to generate an exchange coupling magnetic field required for sufficiently reducing side leading.

What is claimed is:

1. A current-in-plane magnetic sensing element comprising a multilayer film including a first antiferromagnetic layer, a pinned magnetic layer, a non-magnetic material layer and a free magnetic layer in that order from the bottom,
wherein the free magnetic layer comprises a first free magnetic layer having a predetermined dimension in the track-width direction and a second free magnetic layer which is provided on the first free magnetic layer and which has a dimension in the track-width direction larger than that of the first free magnetic layer, a second antiferromagnetic layer for aligning the magnetization direction of the free magnetic layer in one direction is provided as a layer above the second free magnetic layer, and electrode layers in contact with both side portions of the multilayer film along the track-width direction.

2. The magnetic sensing element according to claim 1, wherein the first free magnetic layer and the second free magnetic layer are provided as an integrated ferromagnetic layer.

3. The magnetic sensing element according to claim 1, wherein a non-magnetic intermediate layer is provided between the first free magnetic layer and the second free magnetic layer.

4. The magnetic sensing element according to claim 3, wherein the non-magnetic intermediate layer comprises at least one of Ru, Re, Pd, Os, Ir, Cr, Pt, Au, Cu and Rh.

5. The magnetic sensing element according to claim 4, wherein the non-magnetic intermediate layer comprises Cu.

6. The magnetic sensing element according to claim 1, wherein the dimension in the track-width direction of the first free magnetic layer is 0.18 μm or less.

7. The magnetic sensing element according to claim 6, wherein the dimension in the track-width direction of the first free magnetic layer is 0.15 μm or less.

8. The magnetic sensing element according to claim 1, wherein [(the difference calculated by subtracting the film thickness, along the height of multilayer film, of the free magnetic layer in a track-width region from a film thickness, along the height of the multilayer film, of the free magnetic layer in both side regions of the track-width region)/the film thickness of the free mangnetic layer in the track-width region]×100(%) is with the region of −80% or more, but less than 0%.

9. The magnetic sensing element according to claim 1, wherein the film thickness, along the height of the multilayer film, of the second free magnetic layer in both side regions of a track-width region is 10 angstroms or more, but 50 angstroms or less.

10. The magnetic sensing element according to claim 1, wherein the film thickness, along the height of the multilayer film, of the free magnetic layer in the track-width region is 30 angstroms or more, but 50 angstroms or less.

11. The magnetic sensing element according to claim 1, wherein the second antiferromagnetic layer is laminated on the track-width region of the second free magnetic layer as well, and the film thickness, along the height of the multilayer film, of the second antiferromagnetic layer on the track-width region is smaller than a thickness of the second antiferromagnetic layer, along the height of the multilayer film, in both side region located on both sides thereof.

12. The magnetic sensing element according to claim 11, wherein the second antiferromagnetic layer provided on the track-width region of the second free magnetic layer has a non-antiferromagnetic property, and both the side regions of the second antiferromagnetic layer have an antiferromagnetic property.

13. The magnetic sensing element according to claim 11, wherein one of second antiferromagnetic layer is provided on the track-width region of the second free magnetic layer so as to have a film thickness, along the height of the multilayer film, of 50 angstroms or less, and no antiferromagnetic layer is provided on the track-width region of the free magnetic layer.

14. The magnetic sensing element according to claim 11, wherein a spacing in the track-width direction between inner end surfaces of both the side regions of the second antiferromagnetic layer is large than the dimension in the track-width direction of the first free magnetic layer.

15. The magnetic sensing element according to claim 11, wherein the second antiferromagnetic layer is directly laminated on the second free magnetic layer.

16. The magnetic sensing element according to claim 15, wherein successive film formation of the second antiferromagnetic layer is performed on the second free magnetic layer.

17. The magnetic sensing element according to claim 1, wherein both side regions of the second antiferromagnetic layer, having a spacing therebetween along the track width direction, are provided on the second free magnetic layer, with a third antiferromagnetic layer provided between the second antiferromagnetic layer and the second free magnetic layer.

18. The magnetic sensing element according to claim 17, wherein a non-magnetic intermediate layer is laminated between the third antiferromagnetic layer and both side regions of the second antiferromagnetic layer.

19. The magnetic sensing element according to claim 17, wherein the central portion of the third antiferromagnetic layer has a non-antiferromagnetic property, and both side regions of the third antiferromagnetic layer have an antiferromagnetic property.

20. The magnetic sensing element according to claim 17, wherein the film thickness, along the height of the magnetic film, on the third antiferromagnetic layer is 5 angstroms or more, but 50 angstroms or less.

21. The magnetic sensing element according to claim 17, wherein successive film formation of the third antiferromagnetic layer is performed on the second free magnetic layer.

22. The magnetic sensing element according to claim 1, wherein a pair of the second antiferromagnetic layers having a spacing in the track-width direction are provided on the second free magnetic layer through a pair of ferromagnetic layers provided so as to have a spacing in the track-width direction.

23. The magnetic sensing element according to claim 22, wherein successive film formation of the second antiferromagnetic layers is performed on the ferromagnetic layers.

24. The magnetic sensing element according to claim 22, wherein the total film thickness of the film thickness of the ferromagnetic layer and a film thickness of the second free magnetic layer is smaller than a total film thickness of the film thickness of the first free magnetic layer and a film thickness of the second free magnetic layer.

25. The magnetic sensing element according to claim 22, wherein a non-magnetic intermediate layer is laminated between the second free magnetic layer and the ferromagnetic layer.

26. The magnetic sensing element according to claim 25, wherein the non-magnetic intermediate layer comprises at least one noble metal of Ru, Re, Pd, Os, Ir, Pt, Au, Rh and Cu.

27. The magnetic sensing element according to claim 25, wherein the non-magnetic intermediate layer comprises Cr.

28. The magnetic sensing element according to claim 22, wherein the spacing in the track-width direction between the pair of second antiferromagnetic layers is larger than the dimension in the track-width direction of the first free magnetic layer.

* * * * *

UNITED STATES PATENT AND TRADEMARK OFFICE
CERTIFICATE OF CORRECTION

| | | |
|---|---|---|
| PATENT NO. | : 6,979,500 B2 | Page 1 of 1 |
| APPLICATION NO. | : 10/603983 | |
| DATED | : December 27, 2005 | |
| INVENTOR(S) | : Naoya Hasegawa et al. | |

It is certified that error appears in the above-identified patent and that said Letters Patent is hereby corrected as shown below:

Column 41, in claim 8, line 3, before "multilayer film, of the free" insert --the--.

Column 41, in claim 8, line 8, delete "with the region" and substitute --within the range-- in its place.

Column 42, in claim 14, line 4, before "than the dimension" delete "large" and substitute --larger-- in its place.

Signed and Sealed this

Twelfth Day of December, 2006

JON W. DUDAS
*Director of the United States Patent and Trademark Office*